United States Patent

Kata

[11] Patent Number: 5,977,617
[45] Date of Patent: Nov. 2, 1999

[54] SEMICONDUCTOR DEVICE HAVING MULTILAYER FILM CARRIER

[75] Inventor: Keiichiro Kata, Tokyo, Japan

[73] Assignee: NEC Corporation, Tokyo, Japan

[21] Appl. No.: 08/854,883

[22] Filed: May 12, 1997

[30] Foreign Application Priority Data

May 10, 1996 [JP] Japan ............................. 8-140713

[51] Int. Cl.⁶ .................................................. H01L 23/495

[52] U.S. Cl. .................................... 257/668; 257/692

[58] Field of Search .................................... 257/668, 666, 257/678, 692, 735, 693, 697

[56] References Cited

U.S. PATENT DOCUMENTS

| | | | |
|---|---|---|---|
| 5,089,881 | 2/1992 | Panicker | 257/700 |
| 5,254,871 | 10/1993 | Benavides et al. | |
| 5,497,031 | 3/1996 | Kozono | 257/700 |

FOREIGN PATENT DOCUMENTS

| | | | |
|---|---|---|---|
| 2-18354 | 7/1990 | Japan . | |
| 2-189944 | 7/1990 | Japan | 257/668 |
| 4-14461 | 4/1992 | Japan . | |
| 4-254366 | 9/1992 | Japan | 257/668 |
| 5-152375 | 6/1993 | Japan . | |
| 5-218145 | 8/1993 | Japan . | |
| 5-226415 | 9/1993 | Japan . | |
| 6-29352 | 2/1994 | Japan . | |
| 6-53277 | 2/1994 | Japan . | |
| 6-177203 | 6/1994 | Japan . | |
| 7-297342 | 1/1995 | Japan . | |
| 7-297342 | 11/1995 | Japan . | |
| 8-78574 | 3/1996 | Japan . | |
| 9423448 | 10/1994 | WIPO | 257/700 |

*Primary Examiner*—Nathan K. Kelley
*Attorney, Agent, or Firm*—Sughrue, Mion, Zinn, Macpeak & Seas, PLLC

[57] ABSTRACT

A semiconductor device includes multilayer film carriers, a plurality of connection layers having innerleads protruded from the film carriers, and a semiconductor chip having electrode pads connected to the innerleads.

10 Claims, 26 Drawing Sheets

SEMICONDUCTOR DEVICE HAVING MULTILAYER FILM CARRIER

BACKGROUND OF THE INVENTION

1. Field of the Invention

The present invention relates to a semiconductor device, and more particularly, to a semiconductor package having multilayer film carriers.

2. Description of the Related Art

As semiconductor chips have been developed in terms of operating speed, the number of pins and the performance, packages have been also developed for such semiconductor chips.

A semiconductor chip performance is affected by various parameters associated with its package. For example, a parasitic capacitance caused by a signal line serves as a capacitive load which affects the rising/falling speed and waveform of a signal on the signal line. Also, a parasitic inductance caused by a power supply line generates noise in response to a transient change of a power supply voltage due to a switching of a transistor. Further, a parasitic resistance caused by a power supply line or a signal line reduces the voltage thereof. Therefore, it is important to reduce the values of these parameters in the package.

Particularly, in a CMOS logic circuit, the reduction of the parasitic inductance is more important in order to reduce switching noise caused simultaneously by one of a PMOS transistor and an NMOS transistor being turned ON and by the other being turned OFF.

In a prior art ceramic type package, a multilayer substrate is adopted to reinforce power supply layers and ground layers, so that the parasitic inductances thereof are reduced. This will be explained later in detail.

Also, in a prior art lead frame type package which is typically called a quad flat package (QFP) (see JP-A-114461), a power supply layer and a ground layer are constructed by specified plane conductive layers, so that the parasitic inductances thereof can be reduced to about one third of a package where the power supply layer and the ground layer are constructed by a single layer. This will be also explained later in detail.

In the above-described prior art ceramic and lead frame type packages, however, bonding wiring systems are adopted. Therefore, as the number of pins is increased, the pitch of pads is made narrow, so that it is impossible to carry out a bonding operation between the pins and the pads. In addition, although the parasitic inductance caused by bonding wire is dependent upon the length and diameter thereof, this parasitic inductance cannot be ignored.

To avoid the drawbacks of the bonding wire systems, film carrier packages have been developed. For example, in a quad tape carrier package (Q-TCP) using a tape automated bonding (TAB) system, innerleads formed on an insulating film layer are bonded to bumps of a semiconductor chip, and outerleads are formed at the periphery of the package in the same way as in QFPs. Also, in a tape ball grid array (T-BGA), solder balls are arranged in a matrix.

In a first prior art film carrier type package, a double-layer structure is adopted. That is, an insulating film layer has a surface on which a lead frame is formed, and has another surface on which a ground layer is formed. The lead frame has innerleads and outerleads which are both connected via through holes. Thus, the self-inductance of the double-layer film carrier package is about ⅛ of that of the single-layer film carrier package. This will be also explained later in detail.

In the first prior art film carrier type package, however, the formation of small-diameter through holes increases the manufacturing cost; in other words, the manufacturing cost of the insulating film layer is increased. Also, when the number of pins is increased, the pins have to be more-fined, thus increasing the manufacturing cost. Further, it is difficult to adopt a multilayer structure such as triple-layer structure for the film carrier package, and therefore, a power supply layer cannot be provided.

In a second film carrier package (see JP-A-58-152375), a joining pad of a multilayer printed board including a power supply layer and a ground layer is adhered by a solder layer to an insulating film layer (suspender). Thus, the parasitic inductances of the power supply layer and the ground layer can be reduced. This will be also explained later in detail.

In the second prior art film carrier type package, however, a step for manufacturing the multilayer printed board and a step for adhering the multilayer printed board to the insulating film layer increase the manufacturing cost. In addition, in order to reduce the parasitic inductance, the joining pad is arranged in the proximity of a device hole so that the distance between the multilayer printed board and the semiconductor chip is reduced. In this case, a high grade fine pattern technology is required.

In a third prior art film carrier type package (see JP-A-5-218145), an insulating film layer having outerleads thereon is adhered to another insulating film layer having innerleads, so that the outerleads and the innerleads are staggeredly arranged. As a result, power supply pins and ground pins are dispersed, so that the widths of power supply layers and ground layers can be increased. Thus, the parasitic inductances of the power supply layers and the ground layers can be reduced. This will be also explained later in detail.

In the third prior art film carrier type package, however, since connections between the outerleads and the innerleads are realized via the through hole, a fine perforating process such as a punching process for the through hole is required. In this case, the distance between a semiconductor chip and a power supply layer (or a ground layer) is substantially increased. Therefore, when the number of pins is increased, a reduction of the parasitic inductance cannot be expected.

In a fourth prior art film carrier type package (see JP-A-5-226415), leads are alternately formed on both surfaces of an insulting film layer. Therefore, no through holes are required in the insulating film layer. This will be also explained later in detail.

In the fourth prior art film carrier type package, however, it is impossible to apply the leads alternately formed on the insulating film layer to a package where power supply layers, ground layers and signal line layers are dispersedly arranged. Also, since the package is limited to a double player structure, the improvement of electrical properties is insufficient. Further, since the leads are bent, short-circuits, displacement of the leads and deformation of the leads may be invited.

SUMMARY OF THE INVENTION

It is an object of the present invention to provide a film carrier type semiconductor device having a low parasitic inductance capable of reducing the manufacturing cost and having improved electrical properties.

According to the present invention, a semiconductor device includes multilayer film carriers, a plurality of connection layers having innerleads protruded from the film carriers, and a semiconductor chip having electrode pads connected to the innerleads.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENTS

Before the description of the preferred embodiments, prior art semiconductor devices (packages) will be explained with reference to FIGS. 1, 2, 3, 4, 5 and 6.

Figure 1:
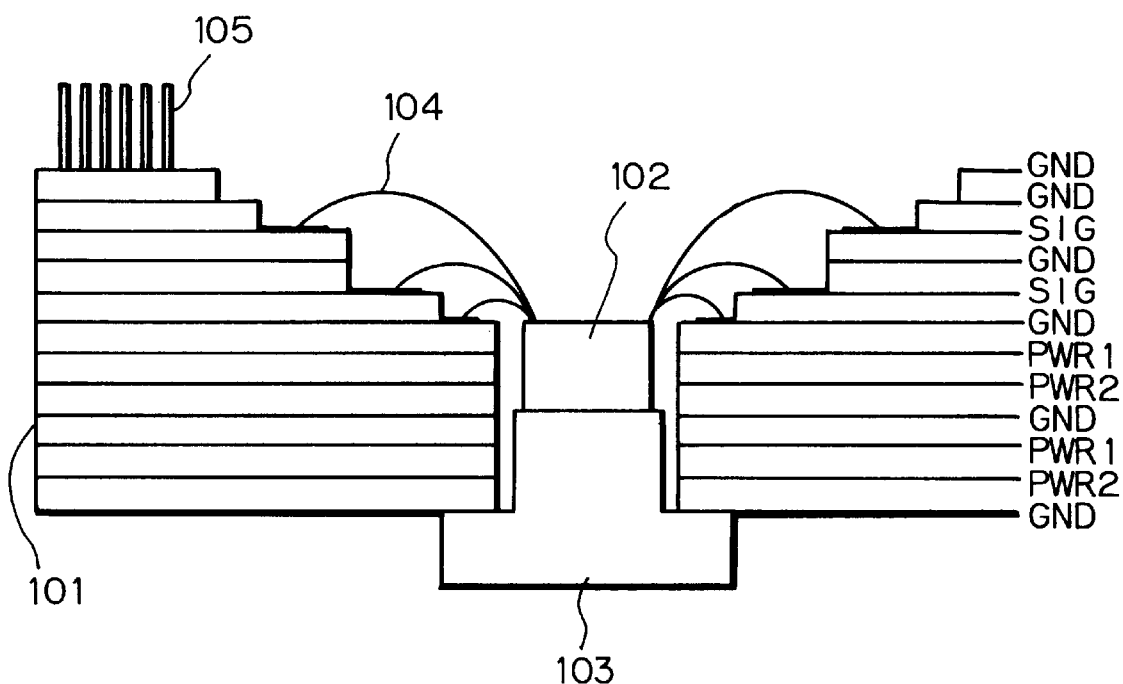
FIG. 1 is a cross-sectional view illustrating a prior art ceramic type package.

In FIG. 1, which illustrates a prior art ceramic type package, a multilayer substrate 101 is adopted to reinforce power supply layers PWR1 and PWR2 and ground layers GND, so that the parasitic inductances thereof are reduced. In FIG. 1, reference numeral 102 designates a semiconductor chip, 103 designates a heat plug, 104 designates a bonding wire, 105 designates an input/output pin, and SIG designates a signal line.

Figure 2:
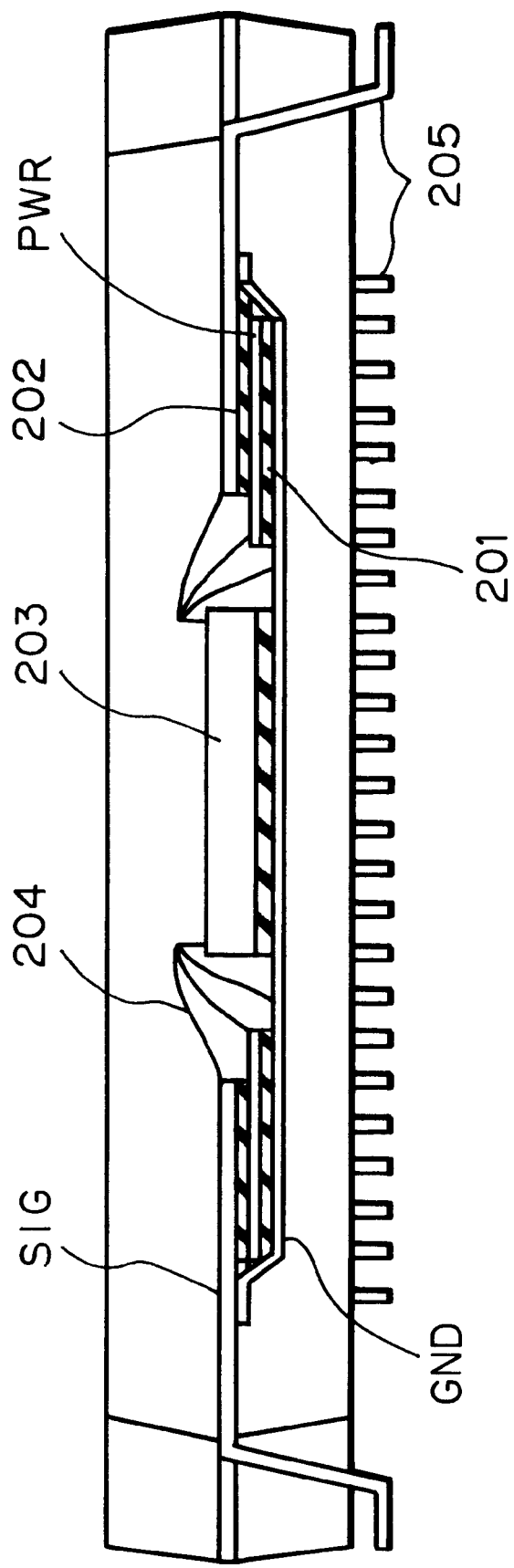
FIG. 2 is a cross-sectional view illustrating a prior art lead frame type package.

In FIG. 2, which illustrates a prior art lead frame type package (see JP-A-4-114461), a power supply layer PWR and a ground layer GND are constructed by specified plane conductive layers, so that the parasitic inductances thereof can be reduced to about one third that of a package where the power supply layer PWR and the ground layer GND are constructed by a single line layer. Also, in order to obtain an impedance matching, insulating layers 201 and 202 are made very thin. In this case, in order to avoid short-circuit due to press burrs caused by a pressing process of a lead frame, the insulating layer 201 is larger than the power supply layer PWR, and the insulating layer 202 is larger than the signal layer SIG.

In the packages of FIGS. 1 and 2, which adopt bonding wiring systems, as the number of pins is increased, the pitch of pads is made narrow, so that it is impossible to carry out a bonding operation between the pins and the pads. In addition, although the parasitic inductance by the bonding wire is dependent upon the length and diameter thereof, this parasitic inductance cannot be ignored.

Figure 3:
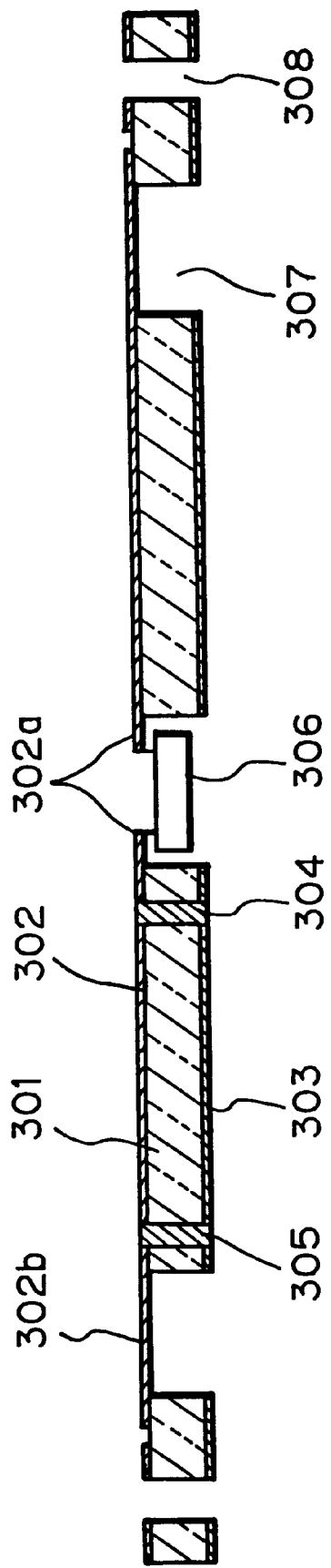
FIG. 3 is a cross-sectional view illustrating a first prior art film carrier type package.

In FIG. 3, which illustrates a first prior art film carrier type package, a double-layer structure is adopted. That is, an insulating film layer 301 has a surface on which a lead frame 302 made of copper foil is formed, and has another surface on which a ground layer 303 made of copper foil is formed. The lead frame 302 has innerleads 302$a$ and outerleads 302$b$ which are both connected via through holes 304 and 305. For example, if the size of a semiconductor chip 306 is 10 mm×10 mm, the pitch of the innerleads 302$a$ is 120 $\mu$m, the pitch of the outerleads 302$b$ is 300 $\mu$m, and the size of the package is 24 mm×24 mm, then the self-inductance is 3 nH. Note that the self-inductance of a single-layer film carrier type package is about 25 nH, and therefore, the self-inductance of the double-layer film carrier type package is about ⅛ of that of a single-layer film carrier type package.

Also, in FIG. 3, reference numeral 307 designates an outerlead hole, and 308 designates a sprocket hole.

In FIG. 3, if the diameter of the through holes 304 and 305 is small, the distance between the semiconductor chip 306 and the ground layer 303 is made substantially smaller, so that the parasitic inductance can be reduced.

In the film carrier type package of FIG. 3, however, the formation of small-diameter through holes increases the manufacturing cost; in other words, the manufacturing cost of the insulating film layer 301 is increased. Also, when the number of pins is increased, the pins have to be more-fined, thus increasing the manufacturing cost. Further, it is difficult to adopt a multilayer structure such as a triple-layer structure for the film carrier package of FIG. 3, and therefore, a power supply layer cannot be provided.

Figure 4:
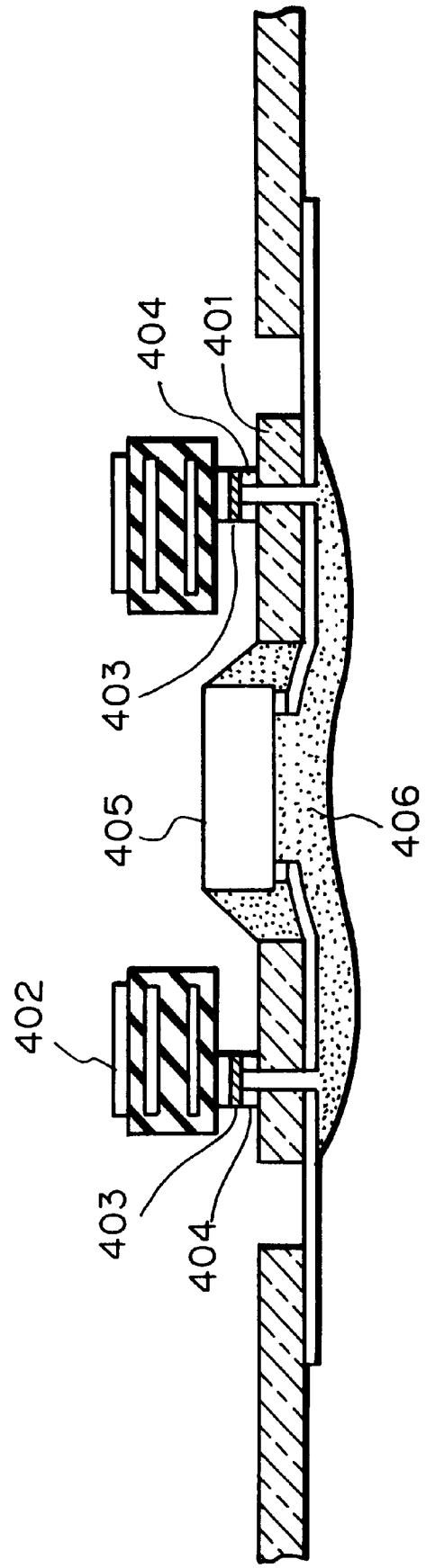
FIG. 4 is a cross-sectional view illustrating a second prior art film carrier type package.

In FIG. 4, which illustrates a second film carrier type package (see JP-A-5-105375), reference numeral 401 designates an insulating film layer (suspender) on which a joining pad 403 of a multilayer printed board 402 including a power supply layer and a ground layer is adhered by a solder layer 404. Thus, the parasitic inductances of the power supply layer and the ground layer can be reduced.

In FIG. 4, note that reference numeral 405 designates a semiconductor chip, and 406 designates a mold resin layer.

In the film carrier type package of FIG. 4, however, a step for manufacturing the multilayer printed board 402 and a step for adhering the multilayer printed board 402 to the insulating film layer 401 increase the manufacturing cost. In addition, in order to reduce the parasitic inductance, the joining pad 403 is arranged in the proximity of a device hole so that the distance between the multilayer printed board 402 and the semiconductor chip 405 is reduced. In this case, a high grade fine pattern technology is required.

Figure 5:
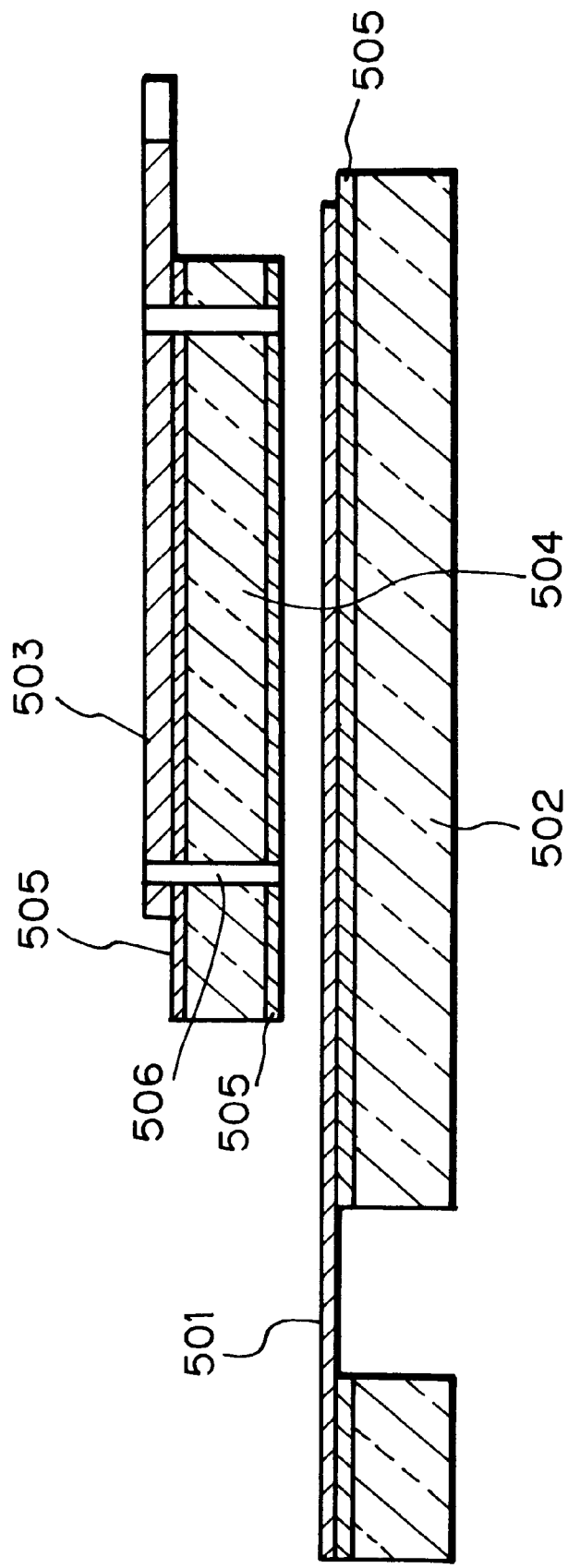
FIG. 5 is a cross-sectional view illustrating a third prior art film carrier type package.

In FIG. 5, which illustrates a third prior art film carrier type package (see JP-A-5-218145), an insulating film layer 502 having outerleads 501 thereon is adhered to an insulating film layer 504 having innerleads 503, so that the outerleads 501 and the innerleads 503 are staggeredly arranged.

As a result, power supply pins and ground pins are dispersed, so that the widths of power supply layers and ground layers can be increased. Thus, the parasitic inductances of the power supply layers and the ground layers can be reduced. In FIG. 5, note that reference numeral 505 designates an adhesive layer, and 506 designates a through hole.

In the film carrier type package of FIG. 5, however, since connections between the outerleads 501 and the innerleads 503 are realized via the through hole 506, a fine perforating process such as a punching process for the through hole 506 is required. In the punching process, the diameter of the through hole 506 is actually 0.2 mm at largest, so that the distance between a semiconductor chip and a power supply layer (or a ground layer) (not shown) is substantially increased. Therefore, when the number of pins is increased, the reduction of the parasitic inductance cannot be expected.

Figure 6:
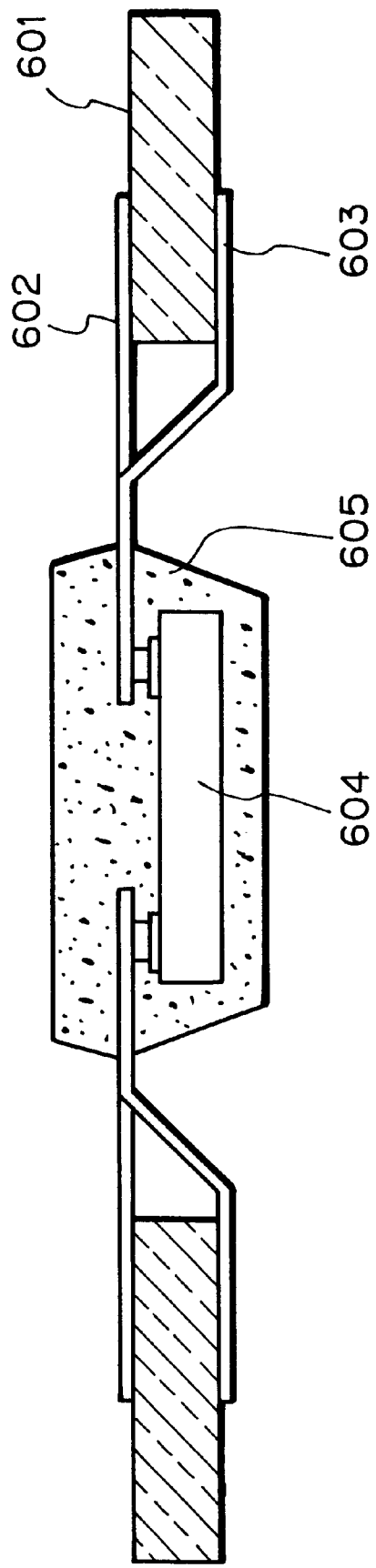
FIG. 6 is a cross-sectional view illustrating a fourth prior art film carrier type package.

In FIG. 6, which illustrates a fourth prior art film carrier type package (see JP-A-5-226415), as the number of pins is increased, leads 602 and 603 are alternately formed on both surfaces of an insulting film layer 601. Therefore, no through holes are required in the insulating film layer 601. In FIG. 6, note that reference numeral 604 designates a semiconductor chip, and 605 designates a molded resin layer.

In the film carrier type package of FIG. 6, however, it is impossible to apply the leads 602 and 603 alternately formed on the insulating film layer 601 to a package where power supply layers, ground layers and signal line layers are dispersedly arranged. Also, since the package is limited to a double-layer structure, the improvement of electrical properties is insufficient. Further, since the leads 603 are bent, short-circuits, displacement of the leads 603 and deformation of the leads 603 may be invited.

FIGS. 7A, 8A, 9A, 10A and 11A are plan views illustrating a first embodiment of the method for manufacturing a semiconductor package according to the present invention, and FIGS. 7B, 8B, 9B 10B and 11B are cross-sectional views of the device of FIGS. 7A, 8A, 9A, 10A and 11A, respectively.

Figure 7A:
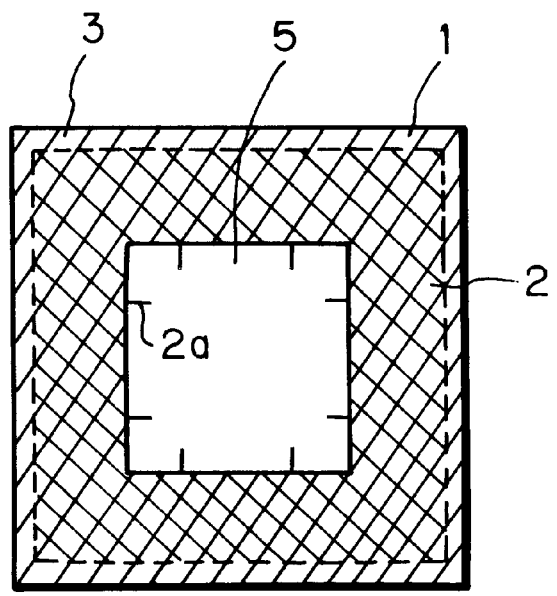
FIGS. 7A, 8A, 9A, 10A and 11A are plan views for explaining a first embodiment of the method for manufacturing a semiconductor package according to the present invention.
Figure 7B:
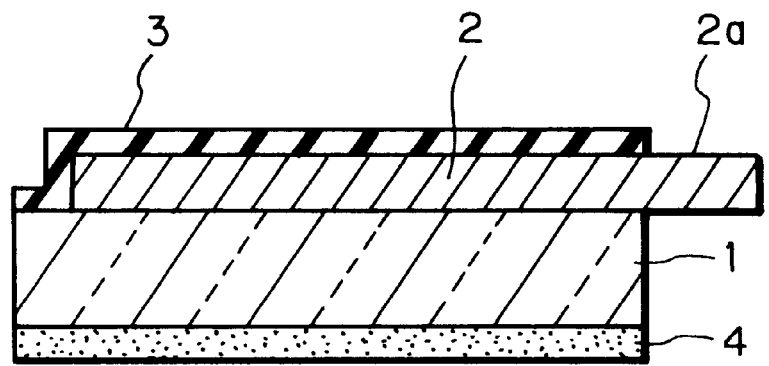
FIGS. 7B, 8B, 9B, 10B and 11B are cross-sectional views of the device of FIGS. 7A, 8A, 9A, 10A and 11A, respectively.

First, referring to FIGS. 7A and 7B, an insulating film layer (suspender) 1 is prepared. Then, a connection layer (in this case, a ground layer) 2 and a solder resist layer 3 are formed on a front surface of the insulating film layer 1. Also, an adhesive layer 4 is formed on a back surface of the insulating film layer 1. In this case, innerleads 2a of the connection layer 2 are protruded from the insulating film layer 1. In FIG. 7A, note that reference numeral 5 designates a device hole.

The connection layer 2 is essentially a solid layer, i.e., a plane conductor, so as to reduce the parasitic inductance thereof, thus improving the electrical properties.

Figure 8A:
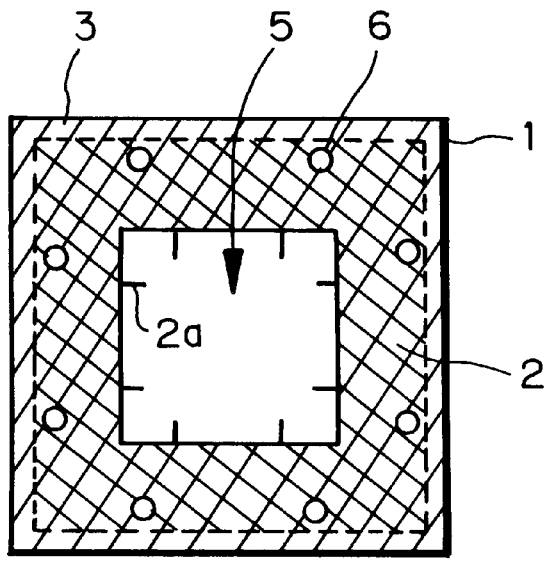
Figure 8B:
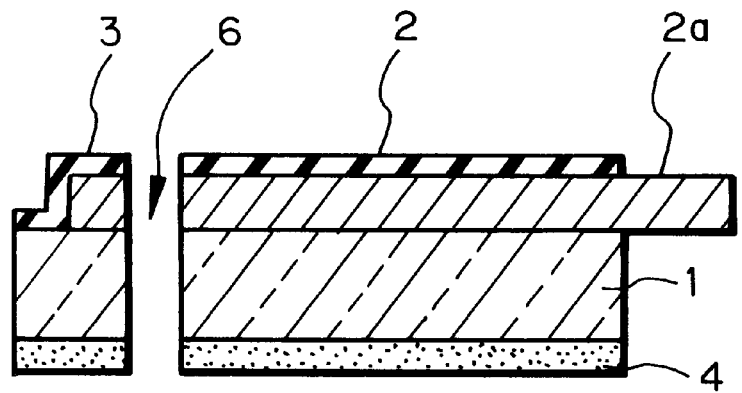

Next, referring to FIGS. 8A and 8B, through holes 6 for connecting the connection layer 2 to underlying pads 14 (not shown in FIG. 8A, but shown in FIG. 9A) are perforated in the solder resist layer 3, the connection layer 2, the insulating film layer 1 and the adhesive layer 4. In this case, the through holes 6 are about 200 to 300 $\mu$m in diameter and are made by a drilling or punching process which is relatively low in cost. Note that the diameter of the through holes of FIGS. 3, 4 and 5 is about 50 $\mu$m, which requires an expensive laser or chemical process.

Figure 9A:
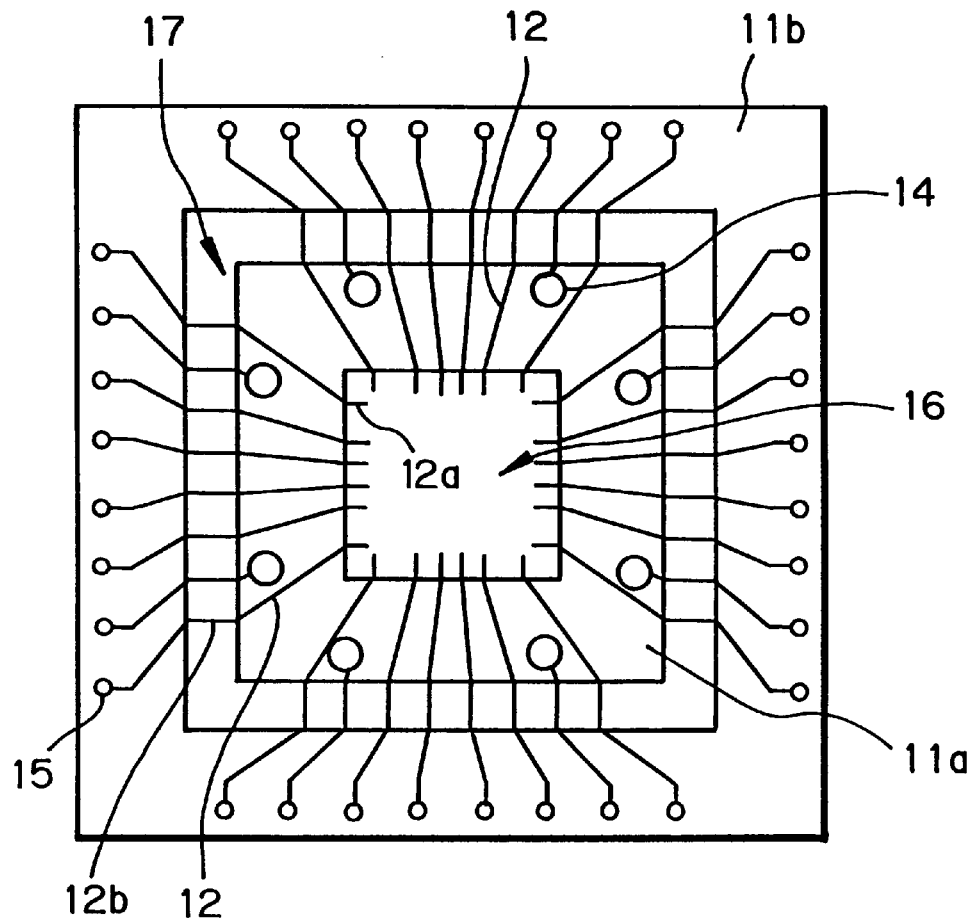
Figure 9B:
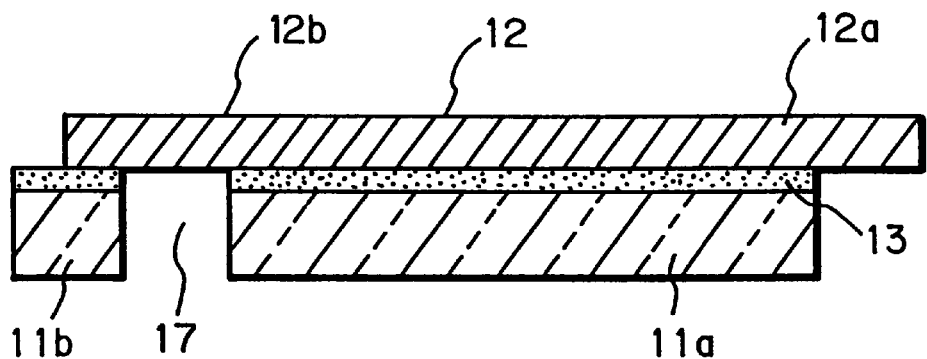

On the other hand, referring to FIGS. 9A and 9B, insulating film layers 11a and 11b are prepared. Then, connection layers (in this case, signal layers) 12 are adhered by an adhesive layer 13 to the insulating film layers 11a and 11b. Here, the insulating film layer 11a serves as a suspender.

Also, pads 14 are formed on the insulating film layer 11a, and test pads 15 are formed on the insulating film layer 11b.

Innerleads 12a of the connection layers 12 are protruded from the insulating film layer 11a. Outerleads 12b of the connection layers 12 are connected to the test pads 15.

In FIGS. 9A and 9B, note that reference numeral 16 designates a device hole, and 17 designates an outerlead hole.

In FIGS. 7A, 7B, 8A, 8B, 9A and 9B, the insulating film layer 1 is made of about 25 to 50 $\mu$m thick polyimide, and the insulating film layers 11a and 11b are made of about 25 $\mu$m thick polyimide. Also, the connection layers 2 and 12 are made of copper foil made by a rolling or electrolytic process, and are preferably about 18 $\mu$m thick in view of the bonding height at an innerlead bonding (ILB) operation. Further, the adhesive layers 4 and 13 are made of epoxy.

Also, in FIGS. 9A and 9B, the adhesive layer 13 is interposed between the insulating film layers 11a and 11b and the connection layer 12. In this case, after the device hole 16 and sprocket holes (not shown) are perforated in the insulating film layers 11a and 11b by a punching process, the connection layer 12 is adhered to the insulating film layers 11a and 11b. However, the insulating film layers 11a and 11b and the connection layer 12 can be a double-layer structure without the adhesive layer 13; in this case, the device hole 16 and the sprocket holes can be perforated in the double-layer structure by a chemical etching process.

Figure 10A:
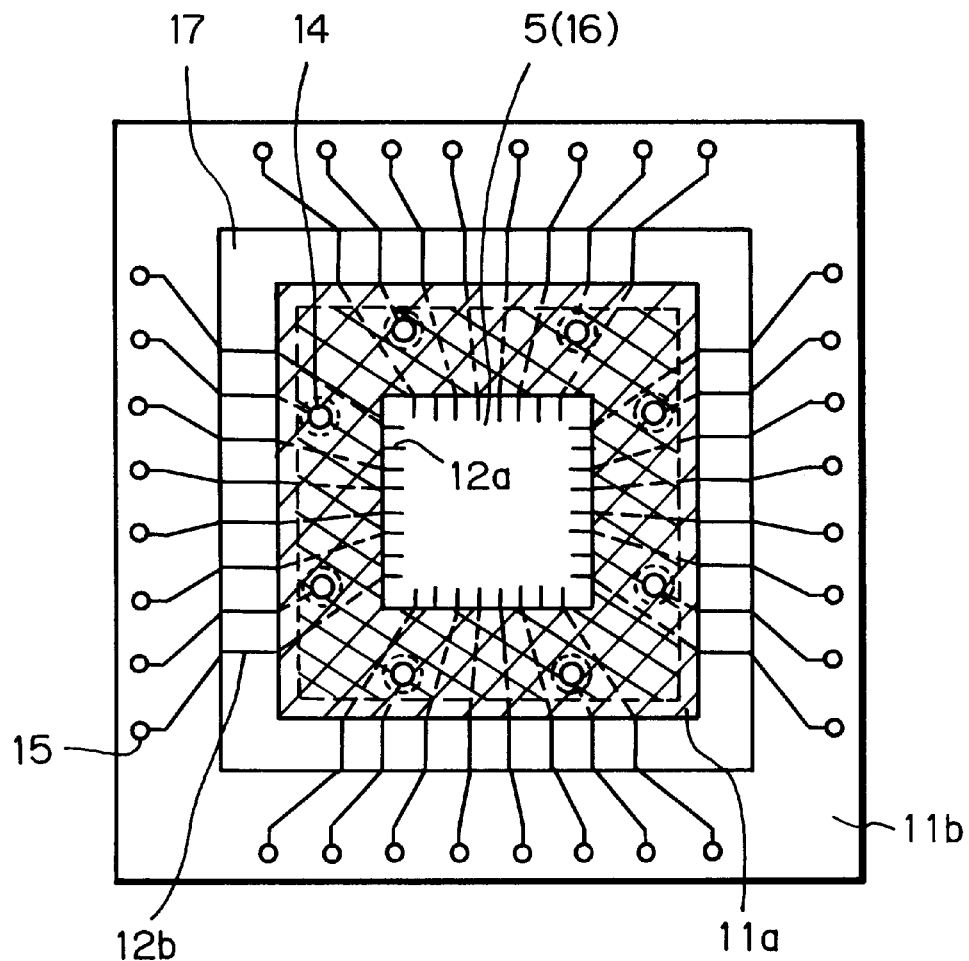
Figure 10B:
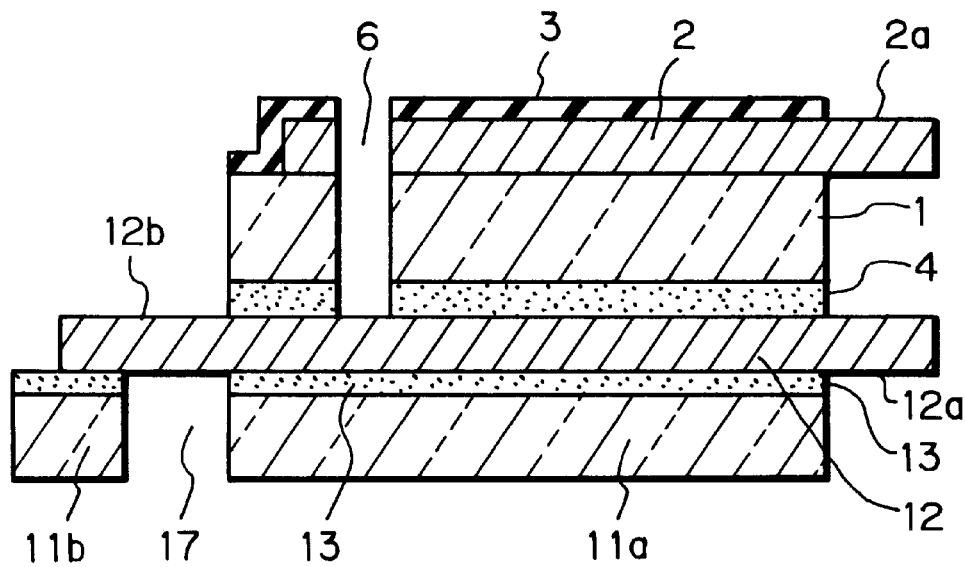

Next, referring to FIGS. 10A and 10B, the device of FIGS. 8A and 8B is adhered to the device of FIGS. 9A and 9B by using a high precision optical alignment mechanism. In this case, the displacement between the innerleads 2a and the innerleads 12a is within ±10 $\mu$m in view of the narrow pitch 100 $\mu$m of electrode pads which will be explained later. Also, the innerwalls of the through holes 6 are cleaned by a chemical process or a plasma ashing process, so that exudate of the adhesive layer 4 into the through holes 6 is also cleaned.

Figure 11A:
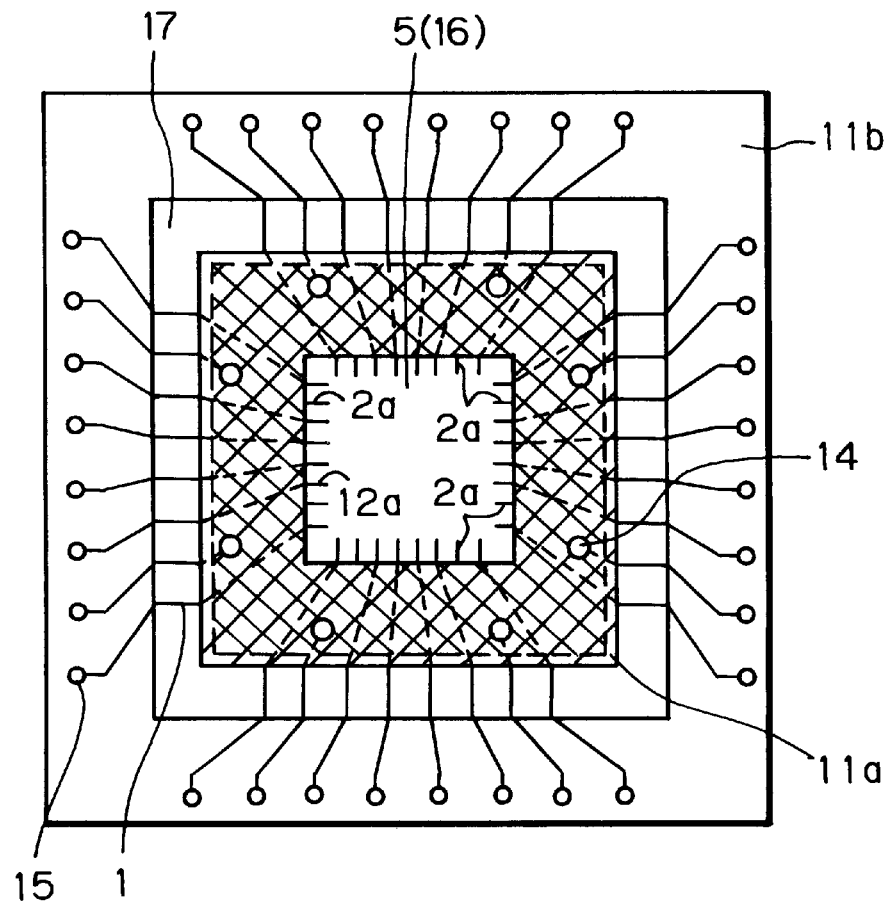
Figure 11B:
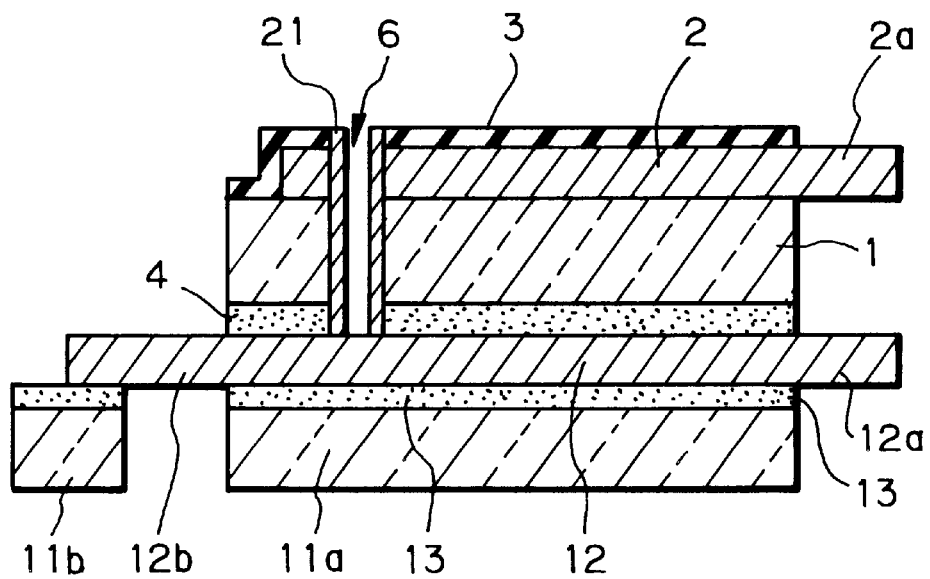

Finally, referring to FIGS. 11A and 11B, a metal layer 21 made of copper or the like is formed within the through holes 6 by an electroless plating process, a sputtering process or a vacuum evaporation process, so that the connection layer 2 is connected to the pads 14.

Thus, a multilayer film carrier is completed.

The mounting of a semiconductor chip on the multilayer film carrier obtained by the first embodiment is explained next with reference to FIGS. 12, 13, 14, 15, 16 and 17. Note that FIG. 16 is a partial enlargement of FIG. 13, and FIG. 17 is a plan view of FIG. 15.

Figure 12:
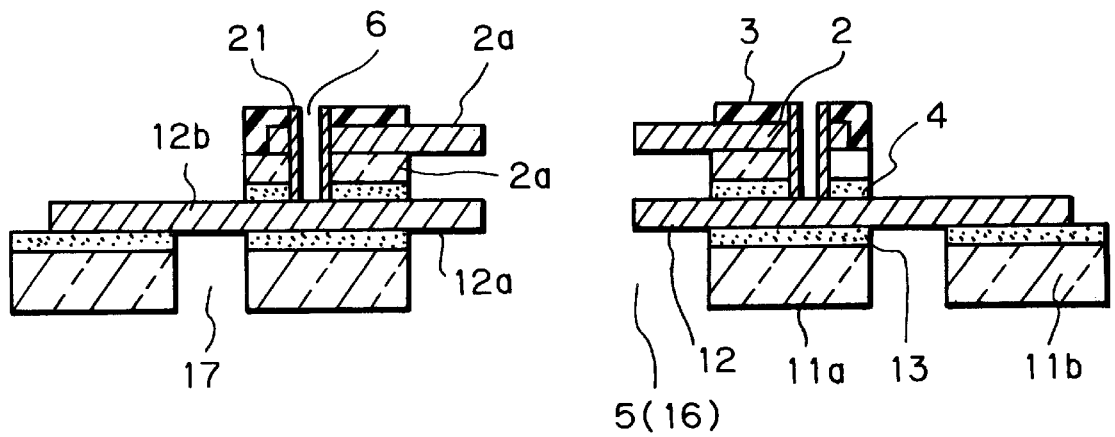
FIGS. 12, 13, 14 and 15 are cross-sectional views for explaining the mounting of a semiconductor chip on the package of the first embodiment.

First, referring to FIG. 12, the innerleads 2a of the connection layer 2 and the innerleads 12a of the connection layers 12 are protruded from the insulating film layers 1 and 12. Also, although the metal layer 21 is provided within the through holes 21 for the connection between the connection layer 2 and the connection layers 12, it is unnecessary to reduce the diameter of the through holes 6.

Figure 13:
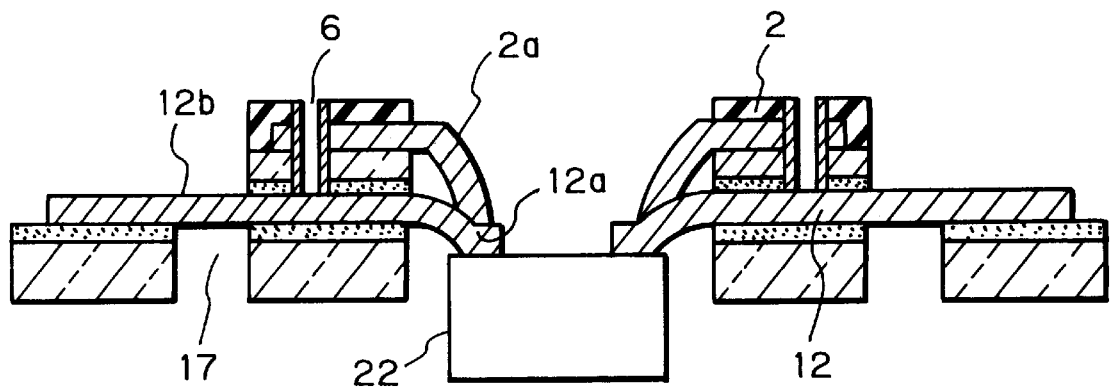
Figure 16:
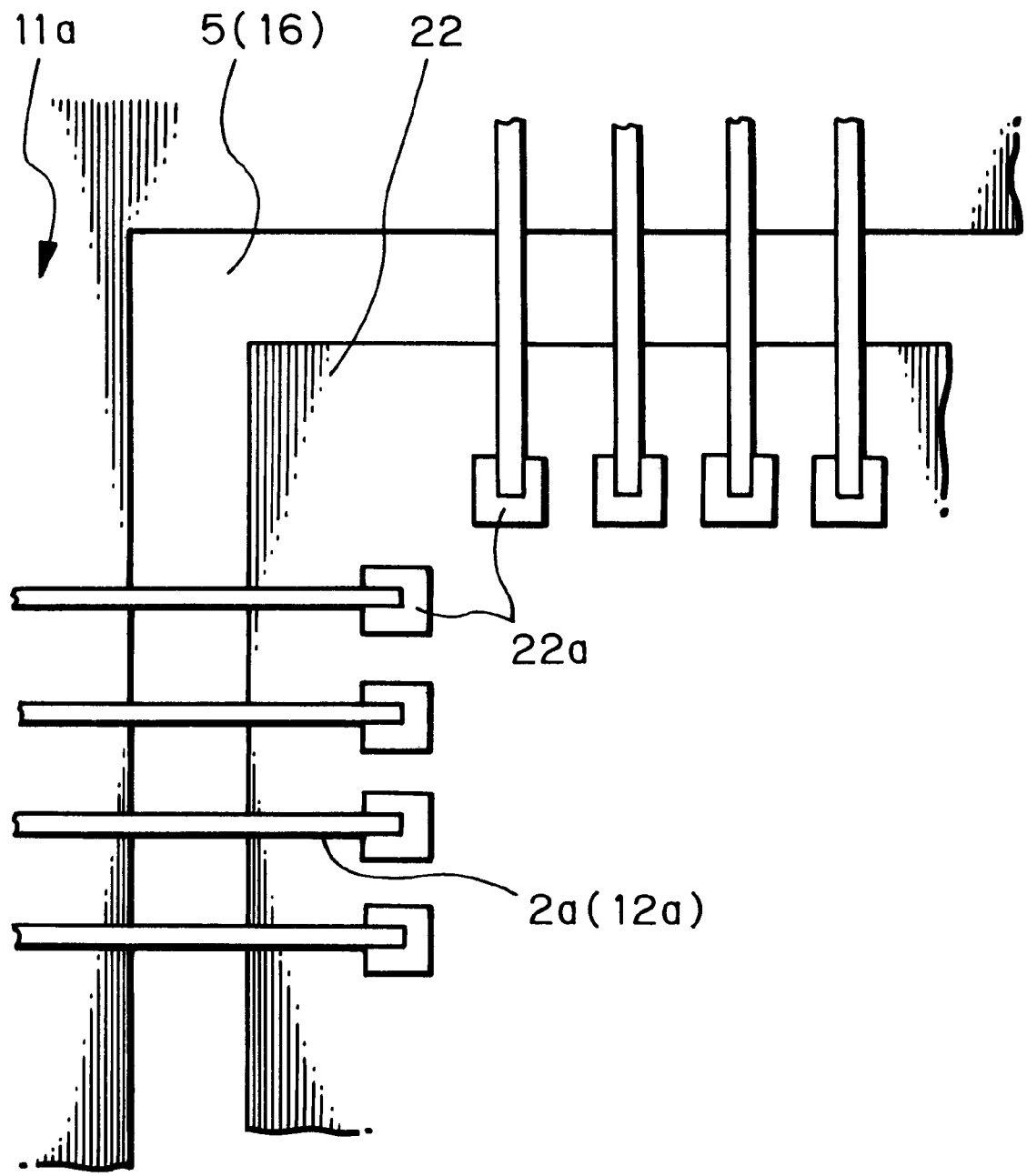
FIG. 16 is a plan view of a partial enlargement of FIG. 13.
Figure 17:
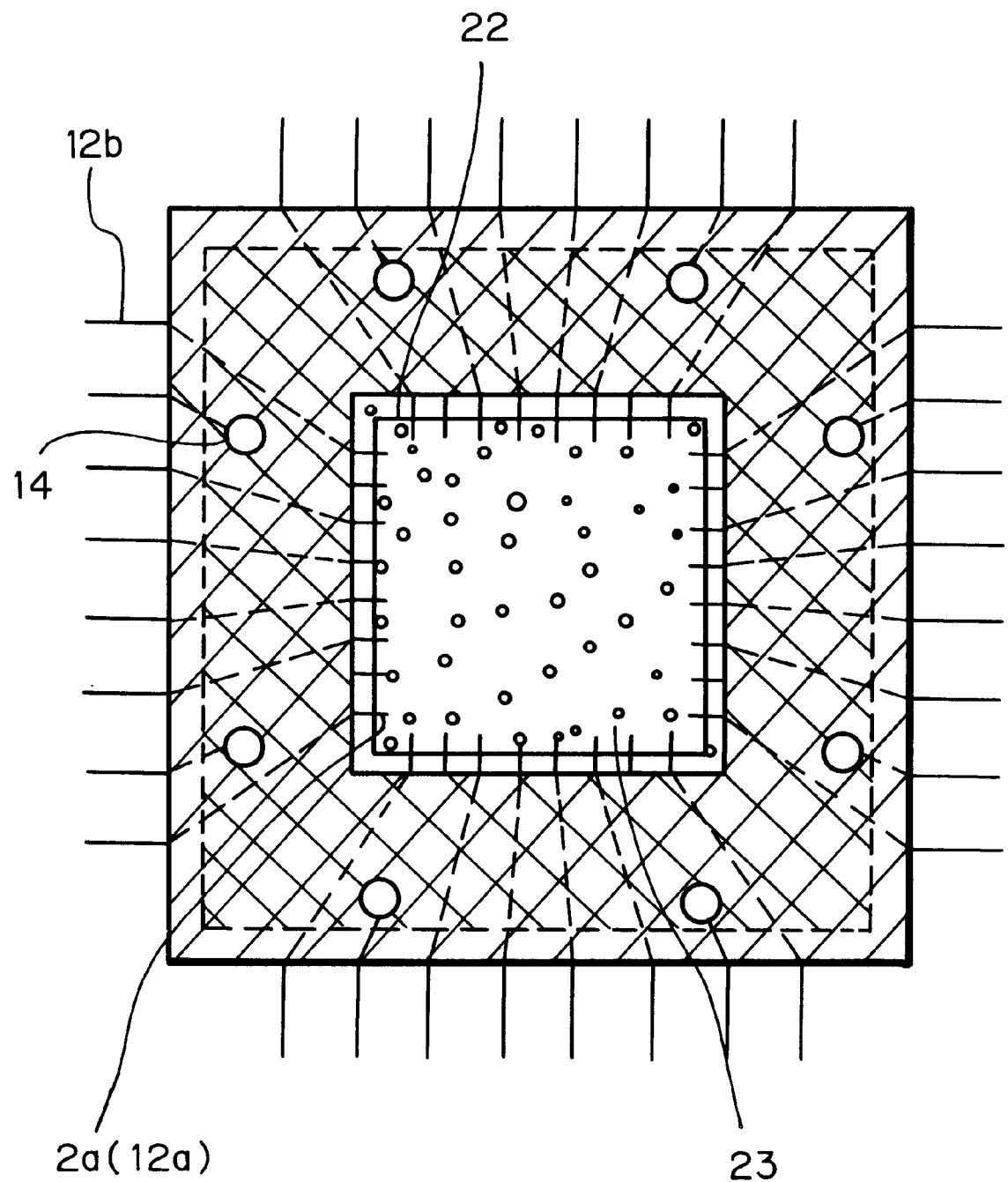
FIG. 17 is a plan view of FIG. 15.

Next, referring to FIGS. 13 and 16, an ILB operation is carried out. That is, electrode pads 22a of a semiconductor chip 22 are bonded via bumps (not shown) to the innerleads 2a and 12a of the connection layers 2 and 12. In this case, the bonding height of the innerleads 2a is larger than that of the innerleads 12a; however, if the difference therebetween is less than 200 $\mu$m, both the bonding operations of the innerleads 2a and 12a can be carried out by a single point bonder.

Figure 14:
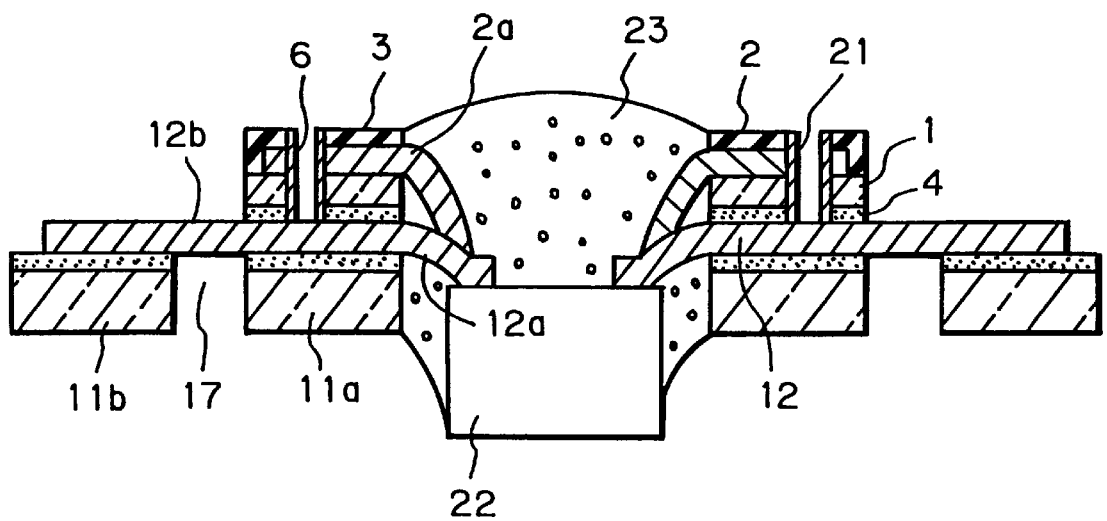

Next, referring to FIG. 14, the device is sealed by a molded resin layer 23.

Figure 15:
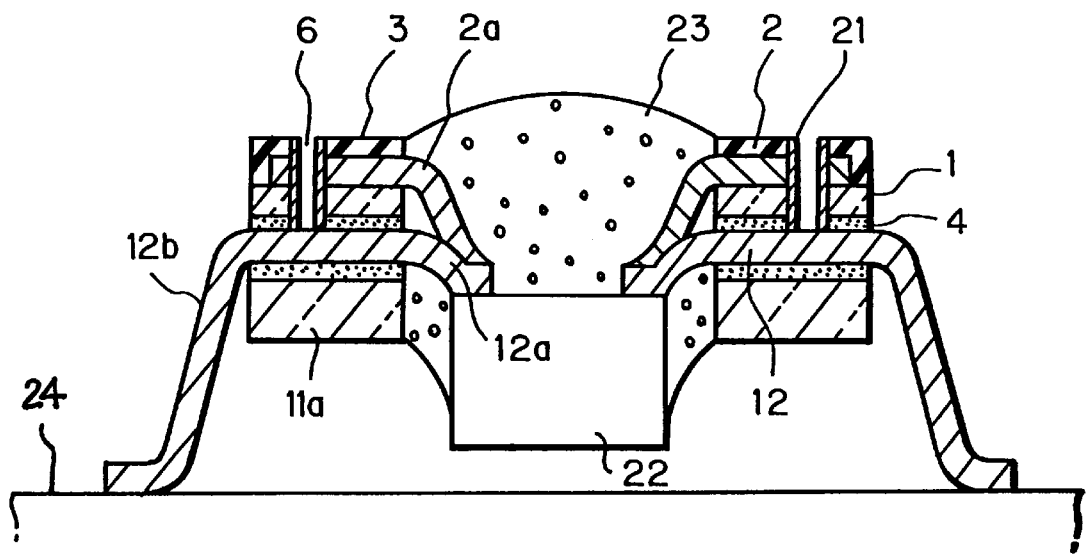

Finally, referring to FIGS. 15 and 17, the insulating film layer 11b associated with the test pads 15 is cut off. Thereafter, an outerlead bonding (OLB) operation is carried out. That is, the outerleads 12b of the connection layers 12 are coupled to a substrate 24, thus completing a mounting operation. Note that FIG. 17 is a plan view of the device of FIG. 15.

FIGS. 18A, 19A, 20A, 21A and 22A are plan views illustrating a second embodiment of the method for manufacturing a semiconductor package according to the present invention, and FIGS. 18B, 19B, 20B, 21B and 22B are cross-sectional views of the device of FIGS. 18A, 19A, 20A, 21A and 22A, respectively. The second embodiment is applied to a double-layer BGA device.

Figure 18A:
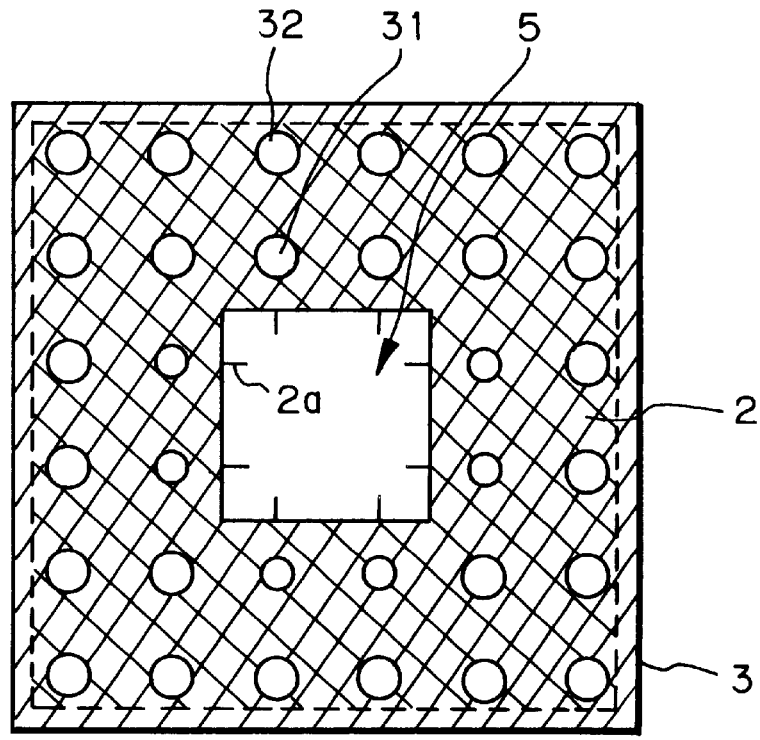
FIGS. 18A, 19A, 20A, 21A and 22A are plan views for explaining a second embodiment of the method for manufacturing a semiconductor package according to the present invention.
Figure 18B:
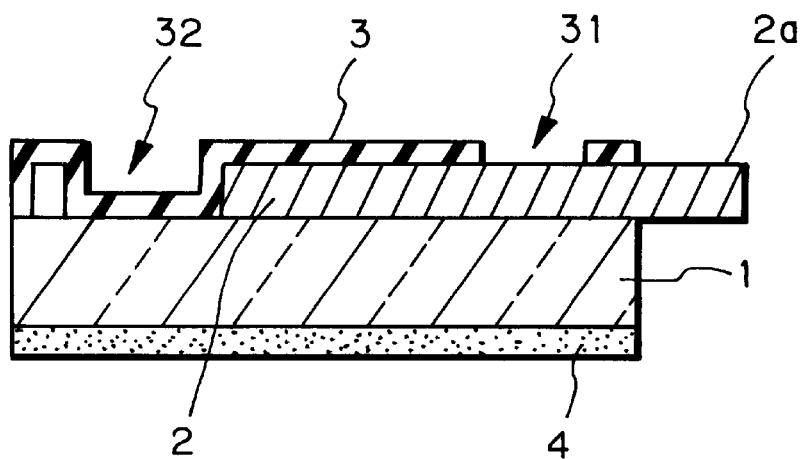
FIGS. 18B, 19B, 20B, 21B and 22B are cross-sectional FIGS. 18A, 19A, 20A, 21A and 22A, respectively.

First, referring to FIGS. 18A and 18B, an insulating film layer (suspender) 1 is prepared. Then, a connection layer (in this case, a ground layer) 2 and a solder resist layer 3 are formed on a front surface of the insulating film layer 1. Also, an adhesive layer 4 is formed on a back surface of the insulating film layer 1. In this case, innerleads 2a of the connection layer 2 are protruded from the insulating film layer 1. In FIG. 18A, note that reference numeral 5 designates a device hole.

In the BGA device, outerpads are provided instead of the outerleads. In order to form outerpads for the connection layer 2, openings 31 are perforated in the solder resist layer 3. On the other hand, in order to form outerpads for the connection layers 12 which will be explained later, openings 32 are perforated in the connection layer 2 in advance. In this case, when the pitch and diameter of the outerpads are 1.27 mm and 0.65 mm, respectively, the diameter of the openings 31 and 32 is 0.75 mm.

Even in FIGS. 18A and 18B, the connection layer 2 is essentially a solid layer, i.e., a plane conductor, so as to reduce the parasitic inductance thereof, thus improving the electrical properties.

Figure 19A:
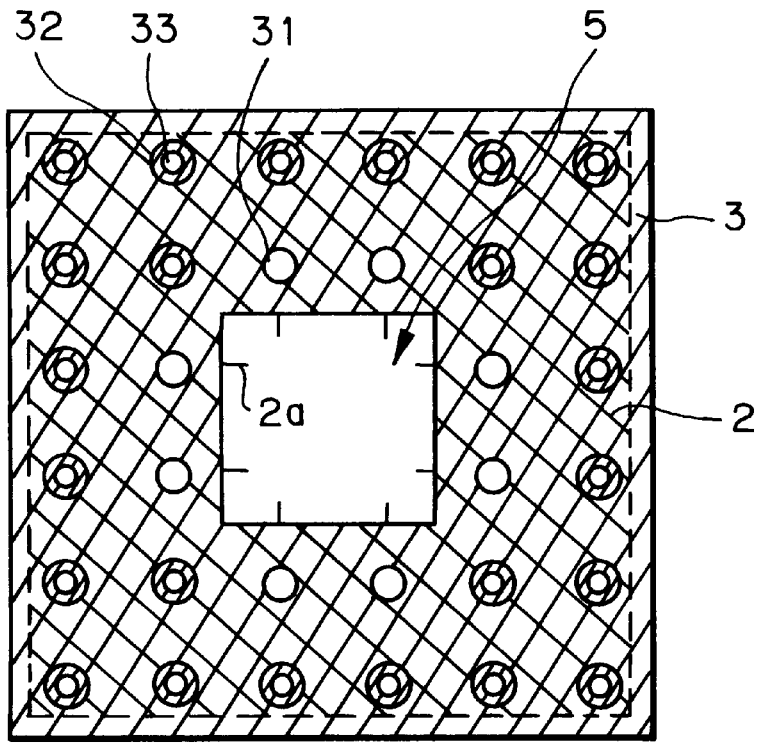
Figure 19B:
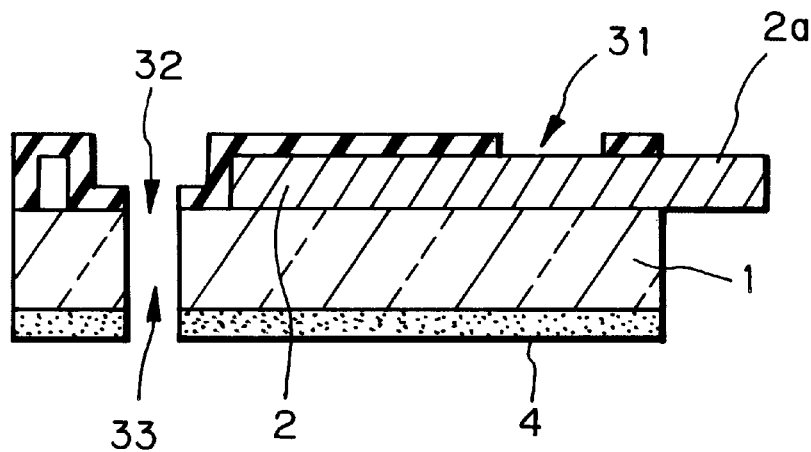

Next, referring to FIGS. 19A and 19B, in order to form the outerpads of connection layers 12 (see FIGS. 20A and 20B), through holes 33 are perforated in the solder resist layer 3, the insulating film layer 1 and the adhesive layer 4. In this case, the through holes 6 are relatively large in diameter and are made by a drilling or punching process which is relatively low in cost.

Figure 20A:
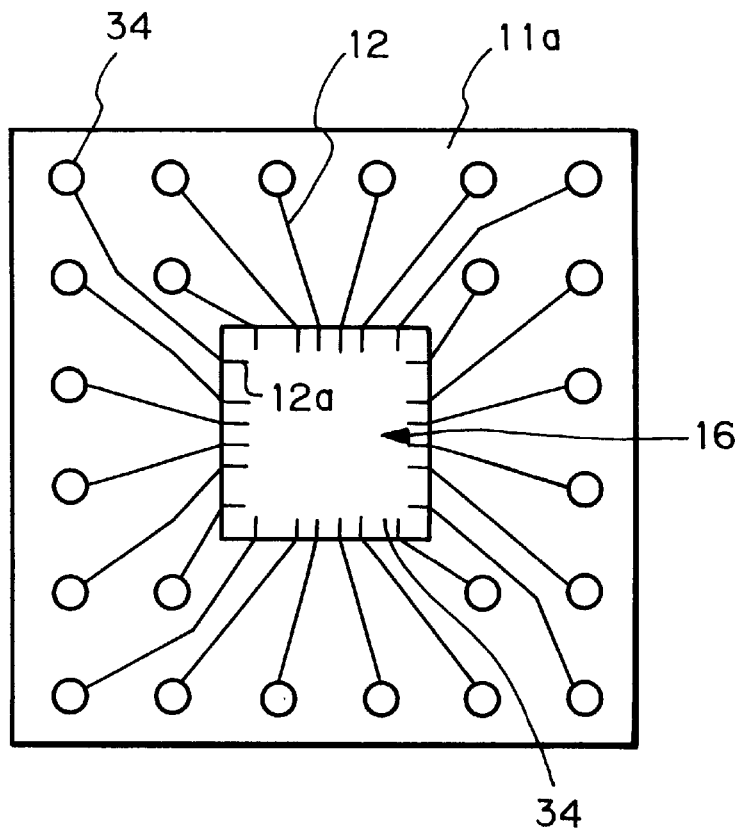
Figure 20B:
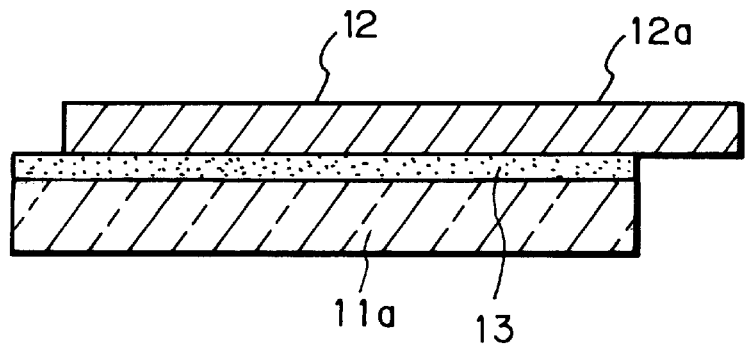

On the other hand, referring to FIGS. 20A and 20B, an insulating film layer 11a is prepared. Then, connection layers (in this case, signal layers) 12 are adhered by an adhesive layer 13 to the insulating film layer 11a. Here, the insulating film layer 11a serves as a suspender. Note that the insulating film layer 11b of FIGS. 9A and 9B is not provided.

Also, innerleads 12a of the connection layers 12 are protruded from the insulating film layer 11a.

In FIGS. 20A and 20B, note that reference numeral 16 designates a device hole.

In FIGS. 18A, 18B, 19A, 19B, 20A and 20B, the insulating film layer 1 is made of about 25 to 50 μm thick polyimide, and the insulating film layer 11a is made of about 25 μm thick polyimide. Also, the connection layers 2 and 12 are made of copper foil by a rolling or electrolytic process, and are preferably about 18 μm thick in view of the bonding height at an ILB operation. Further, the adhesive layers 4 and 13 are made of epoxy.

Also, in FIGS. 20A and 20B, the adhesive layer 13 is interposed between the insulating film layer 11a and the connection layers 12. In this case, after the device hole 16 and sprocket holes (not shown) are perforated in the insulating film layer 11a by a punching process, the connection layers 12 are adhered to the insulating film layer 11a. However, the insulating film layer 11a and the connection layers 12 can be a double-layer structure without the adhesive layer 13; in this case, the device hole 16 and the sprocket holes can be perforated in the double-layer structure by a chemical etching process.

Figure 21A:
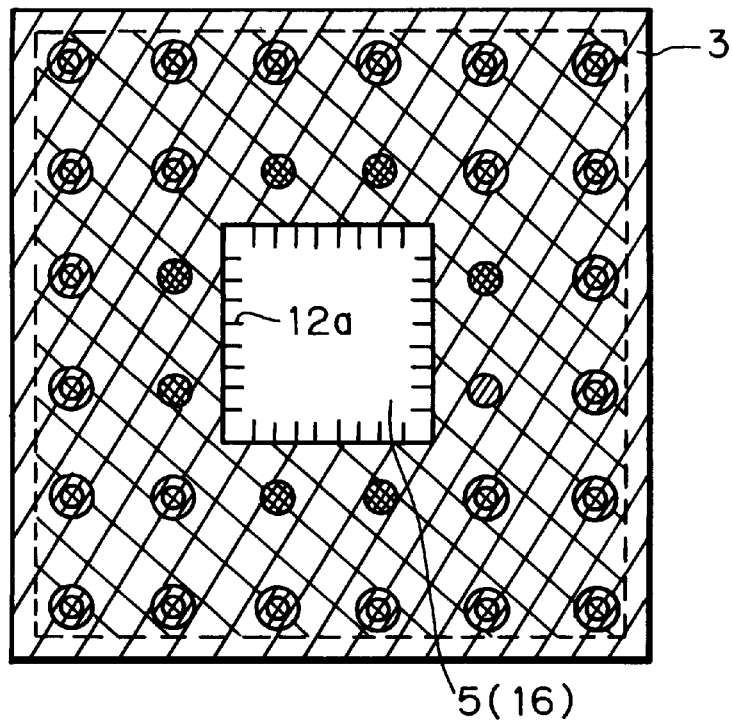
Figure 21B:
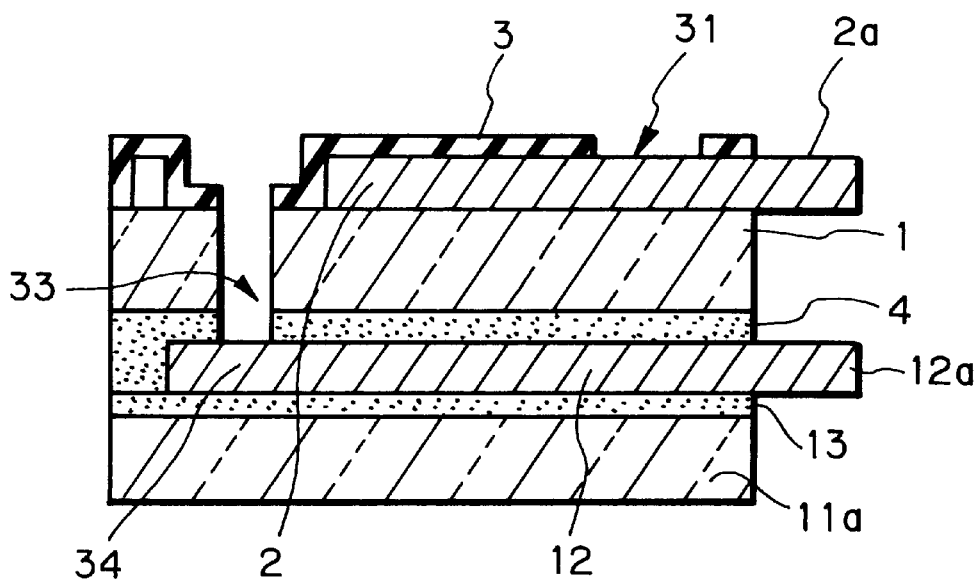

Next, referring to FIGS. 21A and 21B, the device of FIGS. 19A and 19B is adhered to the device of FIGS. 20A and 20B by using a high precision optical alignment mechanism. Also, in this case, the displacement between the innerleads 2a and the innerleads 12a is within ×10 μm in view of the narrow pitch 100 μm of electrode pads which will be explained later. Also, the innerwalls of the through holes 33 are cleaned by a chemical process or a plasma ashing process, so that exudate of the adhesive layer 4 into the through holes 33 is also cleaned.

Figure 22A:
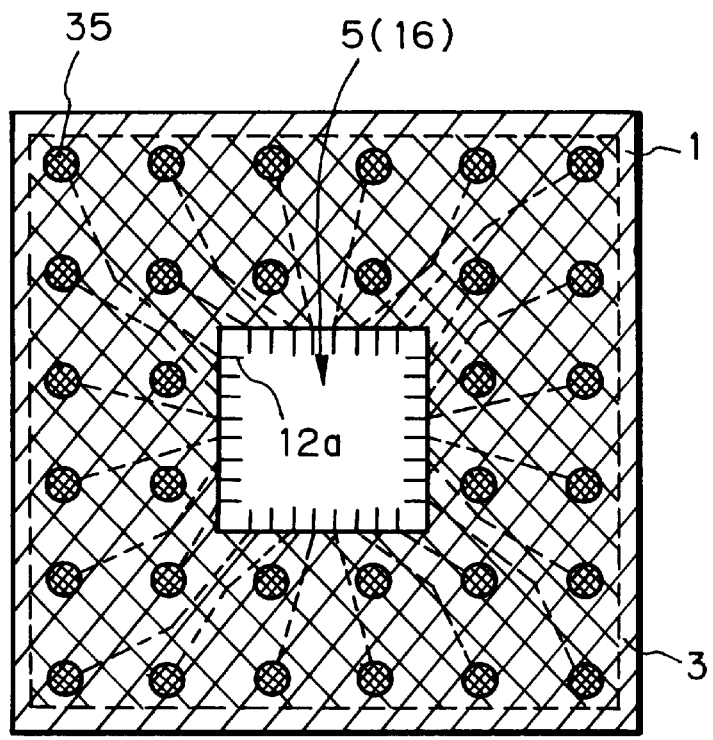
Figure 22B:
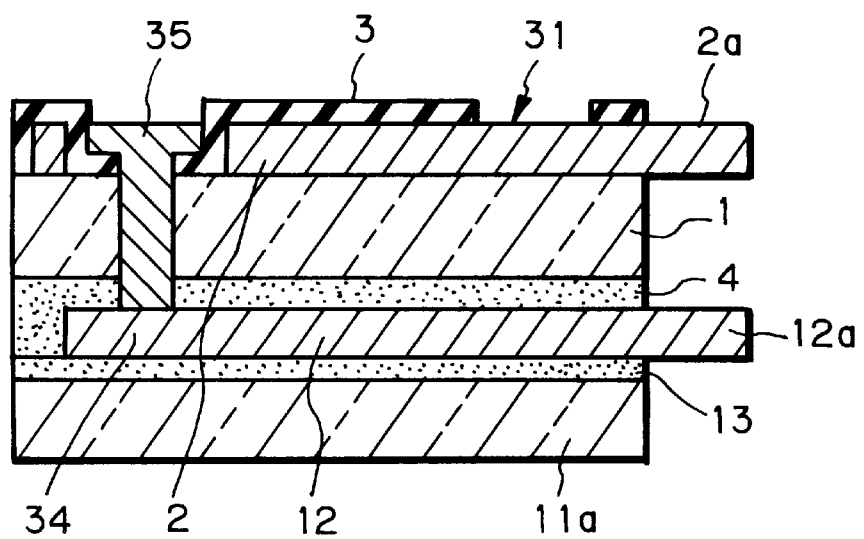

Finally, referring to FIGS. 22A and 22B, a metal layer 35 made of copper or the like is formed within the through holes 33 by an electroless plating process, a sputtering process or a vacuum evaporation process, so that the metal layer 35 serves as an outerpad of each of the connection layers 12.

Thus, a multilayer film carrier is completed.

The mounting of a semiconductor chip on the multilayer film carrier obtained by the second embodiment is carried out in the same way as in the first embodiment as illustrated in FIGS. 12, 13, 14, 15, 16 and 17.

FIGS. 23A, 24A, 25A, 26A, 27A and 28A are plan views illustrating a third embodiment of the method for manufacturing a semiconductor package according to the present invention, and FIGS. 23B, 24B, 25B, 26B, 27B and 288 are cross-sectional views of the device of FIGS. 23A, 24A, 25A, 26A, 27A and 28A, respectively. The second embodiment is applied to a triple-layer BGA device.

Figure 23A:
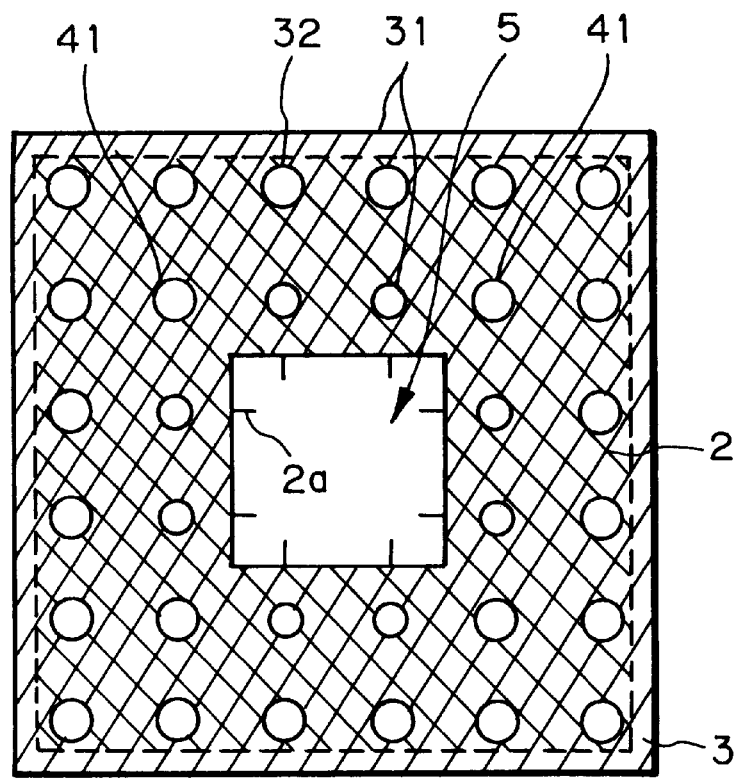
FIGS. 23A, 24A, 25A, 26A, 27A and 28A are plan views for explaining a third embodiment of the method for manufacturing a semiconductor package according to the present invention.
Figure 23B:
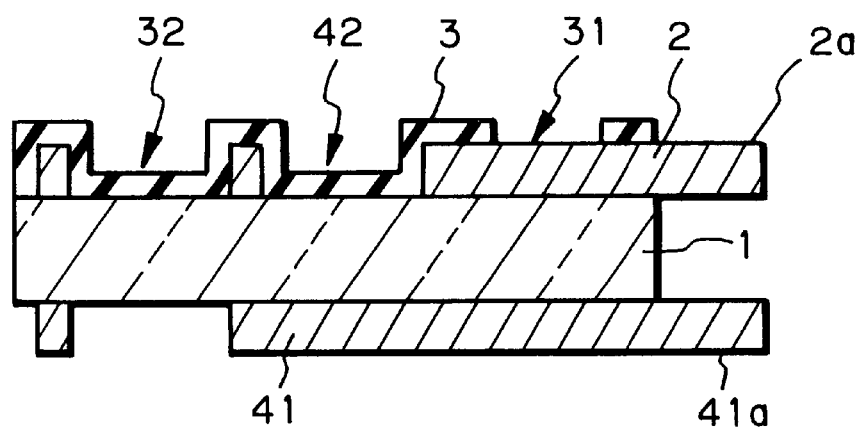
FIGS. 23B, 24B, 25B, 26B, 27B and 28B are cross-sectional views of FIGS. 23A, 24A, 25A, 26A, 27A and 28A, respectively.

First, referring to FIGS. 23A and 23B, an insulating film layer (suspender) 1 is prepared. Then, a connection layer (in this case, a ground layer) 2 and a solder resist layer 3 are formed on a front surface of the insulating film layer 1. Also, a connection layer 41 (in this case, a power supply layer) is formed on a back surface of the insulating film layer 1. In this case, innerleads 2a of the connection layer 2 and innerleads 41a of the connection layer 41 are protruded from the insulating film layer 1. In FIG. 23A, note that reference numeral 5 designates a device hole.

In the BGA device, outerpads are provided instead of the outerleads. In order to form outerpads for the connection layer 2, openings 31 are perforated in the solder resist layer 3. Also, in order to form outerpads for the connection layer 41, openings 42 are perforated in the connection layer 2 in advance. Further, in order to form outerpads for the connection layers 12 which will be later explained, openings 32 are perforated in the connection layer 2 in advance. In this case, when the pitch and diameter of the outerpads are 1.27 mm and 0.65 mm, respectively, the diameter of the openings 31, 32 and 42 is 0.75 mm.

Even in FIGS. 23A and 23B, the connection layers 2 and 41 are essentially solid layers, i.e., plane conductors, so as to reduce the parasitic inductance thereof, thus improving the electrical properties.

Figure 24A:
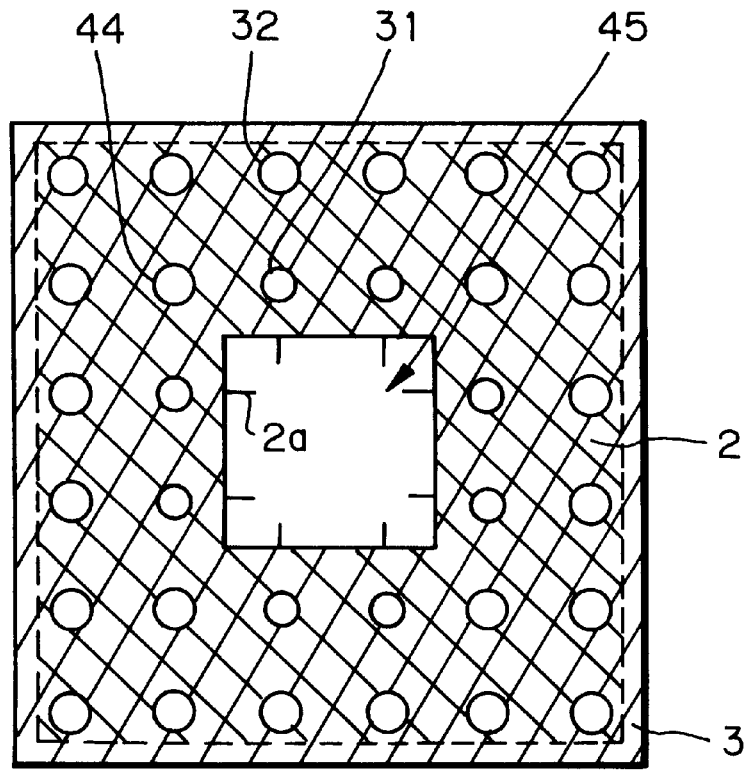
Figure 24B:
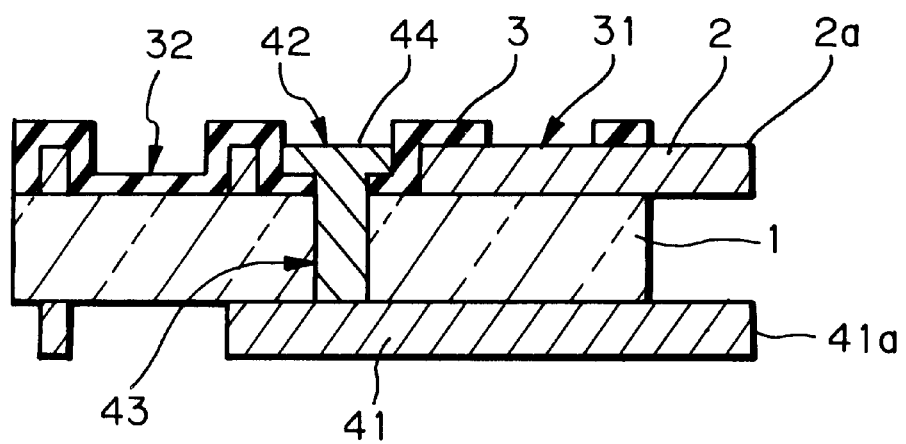

Next, referring to FIGS. 24A and 24B, in order to form the outerpads of connection layers 41, through holes 43 are perforated in the solder resist layer 3, the insulating film layer 1 and the connection layer 41. In this case, the through holes 43 are relatively large in diameter and are made by a drilling or punching process which is relatively low in cost.

Figure 25A:
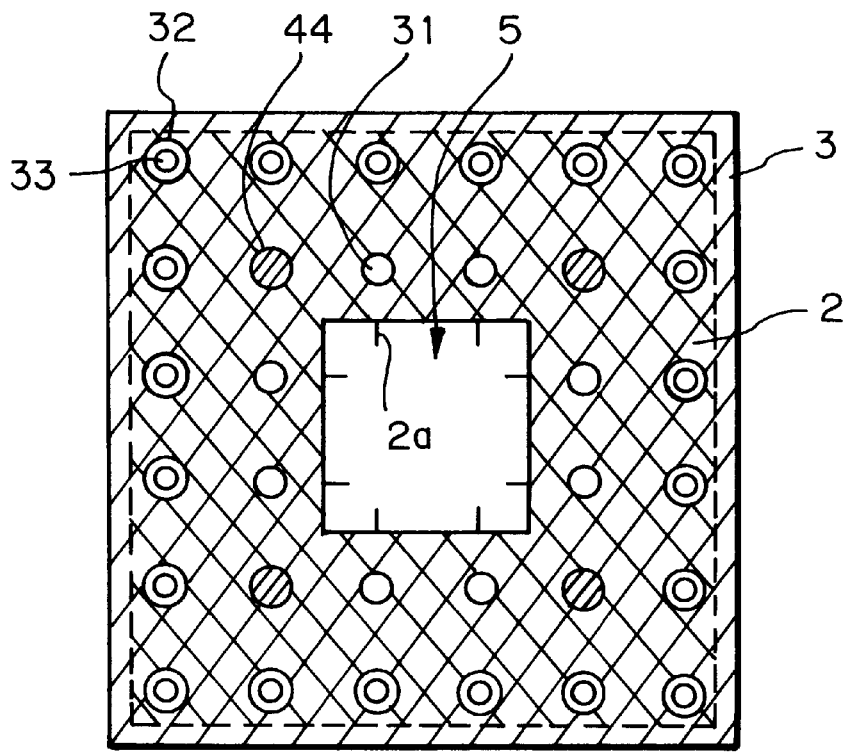
Figure 25B:
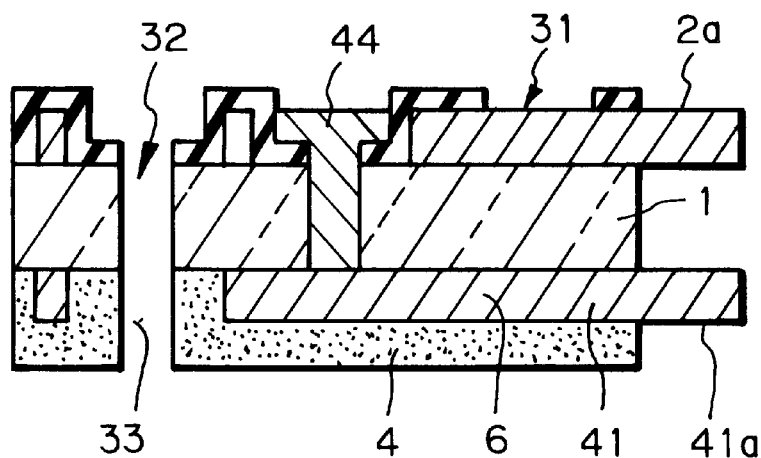

Next, referring to FIGS. 25A and 25B, in order to form the outerpads of connection layers 12 (see FIGS. 26A and 26B), through holes 33 are perforated in the solder resist layer 3 and the insulating film layer 1. In this case, the through holes 33 are relatively large in diameter and are made by a drilling or punching process which is relatively low in cost. Then, an adhesive layer 4 is coated on the back surface of the device.

Figure 26A:
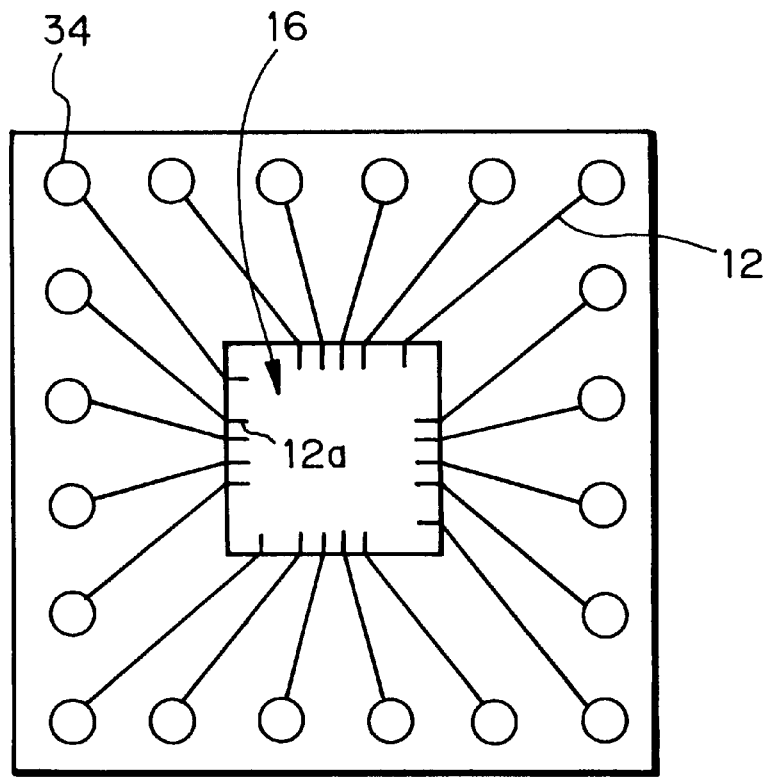
Figure 26B:
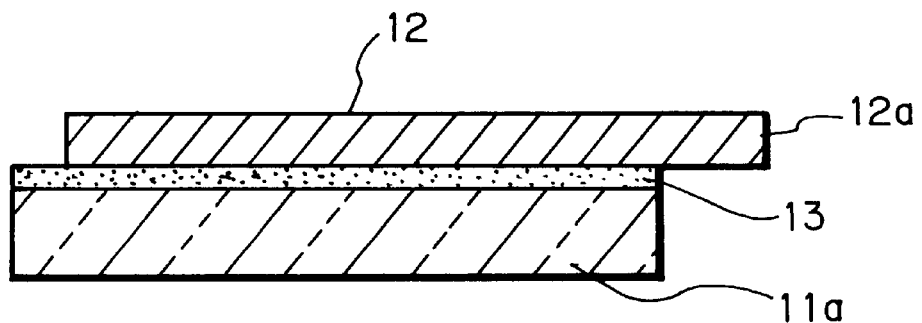

On the other hand, referring to FIGS. 26A and 26B, an insulating film layer 11a is prepared. Then, connection layers (in this case, signal layers) 12 are adhered by an adhesive layer 13 to the insulating film layer 11a. Here, the insulating film layer 11a serves as a suspender. Also, pads 34 are provided on the insulating film layer 11a.

Also, innerleads 12a of the connection layers 12 are protruded from the insulating film layer 11a.

In FIGS. 26A and 26B, note that reference numeral 16 designates a device hole.

In FIGS. 23A, 23B, 24A, 24B, 25A, 25B, 26A and 26B, the insulating film layer 1 is made of about 25 to 50 $\mu$m thick polyimide, and the insulating film layer 11a is made of about 25 $\mu$m thick polyimide. Also, the connection layers 2, 12 and 41 are made of copper foil made by a rolling or electrolytic process, and are preferably about 18 $\mu$m thick in view of the bonding height at an ILB operation. Further, the adhesive layers 4 and 13 are made of epoxy.

Also, in FIGS. 26A and 26B, the adhesive layer 13 is interposed between the insulating film layer 11a and the connection layers 12. In this case, after the device hole 16 and sprocket holes (not shown) are perforated in the insulating film layer 11a by a punching process, the connection layers 12 is adhered to the insulating film layer 11a. However, the insulating film layer 11a and the connection layers 12 can be a double-layer structure without the adhesive layer 13; in this case, the device hole 16 and the sprocket holes can be perforated in the double-layer structure by a chemical etching process.

Figure 27A:
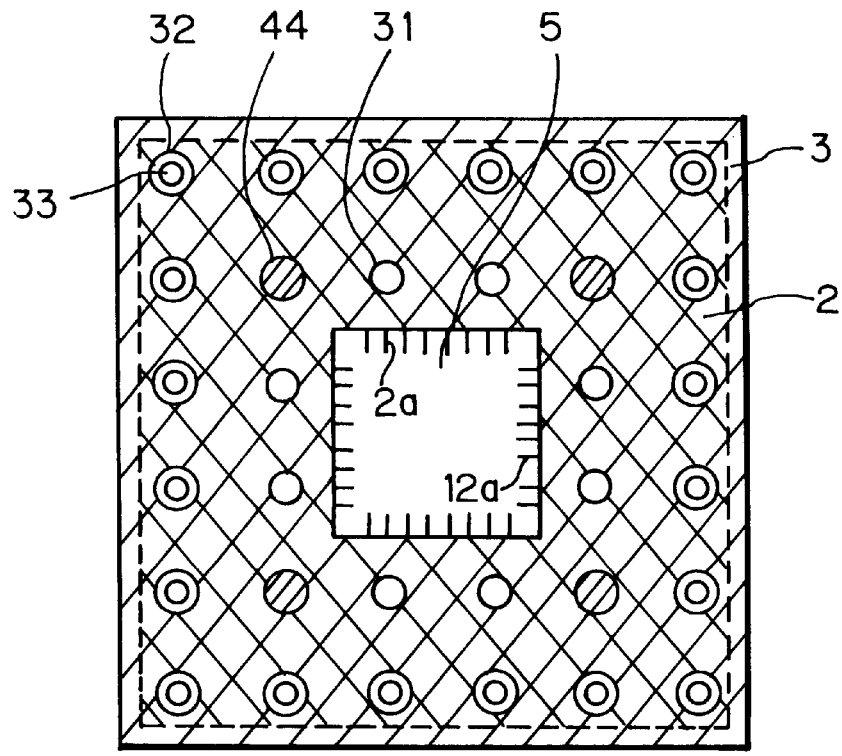
Figure 27B:
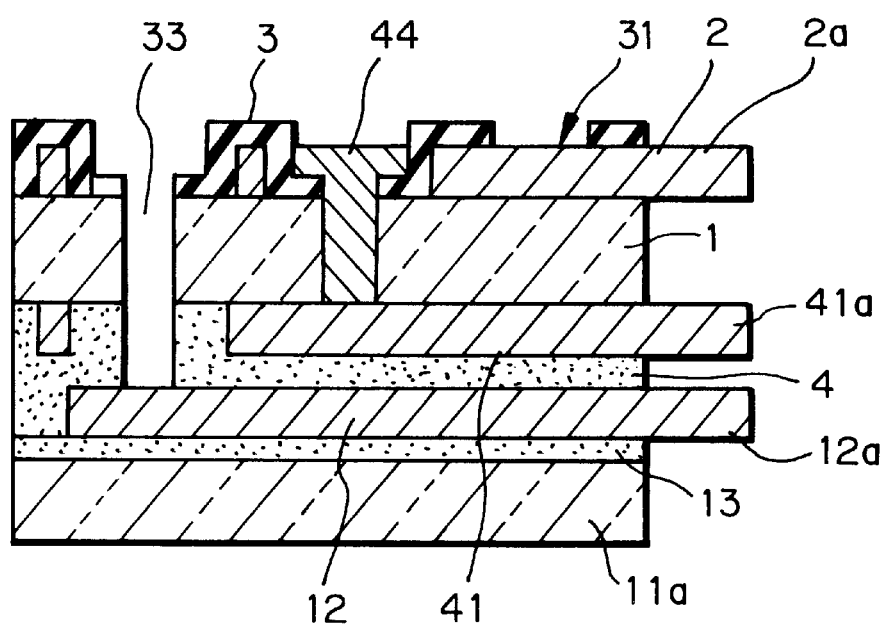

Next, referring to FIGS. 27A and 27B, the device of FIGS. 25A and 25B is adhered to the device of FIGS. 26A and 26B by using a high precision optical alignment mechanism. Also, in this case, the displacement between the innerleads 2a (41a) and the innerleads 12a is within ±10 $\mu$m in view of the narrow pitch 100 $\mu$m of electrode pads which will be explained later. Also, the innerwalls of the through holes 33 are cleaned by a chemical process or a plasma ashing process, so that exudate of the adhesive layer 4 into the through holes 33 is also cleaned.

Figure 28A:
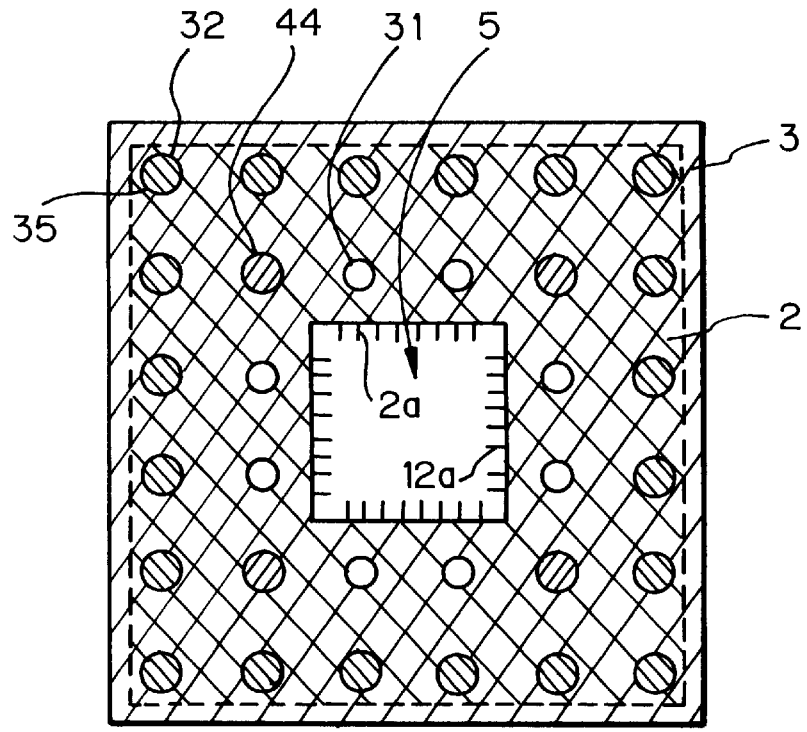
Figure 28B:
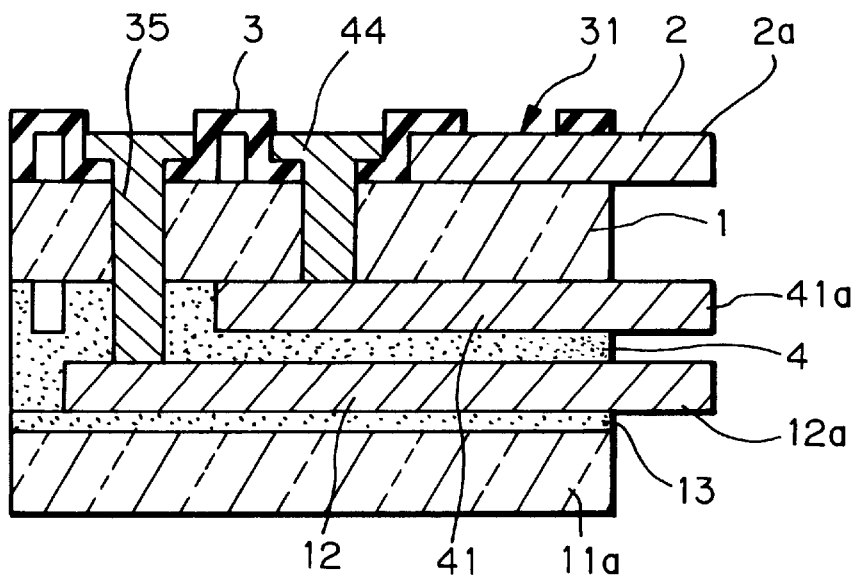

Finally, referring to FIGS. 28A and 28B, a metal layer 35 made of copper or the like is formed within the through holes 33 by an electroless plating process, a sputtering process or a vacuum evaporation process, so that the metal layer 35 serves as an outerpad of each of 30 the connection layers 12.

Thus, a multilayer film carrier is completed.

The mounting of a semiconductor chip on the multilayer film carrier obtained by the third embodiment is carried out in the same way as in the first embodiment as illustrated in FIGS. 12, 13, 14, 15, 16 and 17.

In the above-mentioned embodiments, a one-side film carrier is adhered to a double-side film carrier, to realize a double-layer conductive structure or a triple-layer conductive structure. However, two double-side film carriers can be used to realize a multilayer conductive structure such as a four-layer conductive structure under the condition that the bonding height of innerleads is within a range determined by single point bonder.

As explained hereinabove, according to the present invention, since two one-side or double-side film carriers are adhered to each other, and innerleads protruded from the film carriers are connected to electrodes of a semiconductor chip, the manufacturing cost can be reduced, and the electrical properties can be improved to reduce the noise and enhance the operating frequency.

I claim:

1. A semiconductor device comprising:
   a first insulating film layer;
   a first connection layer formed on said first insulating layer and having a first innerlead and a first outerpad;
   a second insulating film layer formed on said first connection layer;
   a second connection layer formed on said second insulating layer and having a second innerlead and a second outerpad;
   a metal layer buried in a through hole perforated in said second insulating layer and connected to said second outerpad; and
   a semiconductor chip having respective electrode pads connected to said first and second innerleads, said first and second innerleads protruding from said first and second insulating film layers, respectively; and
   wherein said second connection layer is formed on an entire surface of said second insulating film layer.

2. A semiconductor device comprising:
   a first insulating film layer;
   a first connection layer formed on said first insulating layer and having a first innerlead and a first outerpad;
   a second insulating film layer formed on said first connection layer;
   a second connection layer formed on a back surface of said second insulating layer and having a second innerlead and a second outerpad, said second connection layer being electrically isolated from said first connection layer by an adhesive layer;
   a third connection layer formed on a front surface of said second insulating film layer having a third innerlead and a third outerpad;
   a first metal layer buried in a first through hole perforated in said second insulating layer and connected to said first outerpad;
   a second metal layer buried in a second through hole perforated in said second insulating layer and connected to said second outerpad; and
   a semiconductor chip having respective electrode pads connected to said first, second and third innerleads,
   said first, second and third innerleads protruding from said respective first and second insulating film layers.

3. The device as set forth in claim 2, wherein said first connection layer is a signal layer, said second connection layer is a power supply layer, and said third connection layer is a ground layer.

4. The device as set forth in claim 2, wherein said third connection layer is formed entirely on the front surface of said second insulating film layer.

5. A semiconductor package comprising:
   a first insulating film layer;
   a first connection layer formed on said first insulating layer and having a first innerlead and a first outerpad;
   a second insulating film layer formed on said first connection layer;
   a second connection layer formed on said second insulating layer and having a second innerlead and a second outerpad; and a metal layer buried in a through hole perforated in said second insulating layer and connected to said second outerpad, said first and second innerleads protruding from said first and second insulating film layers, respectively; and wherein said second connection layer is formed on an entire surface of said second insulating film layer.

6. A semiconductor package comprising:

a first insulating film layer;

a first connection layer formed on said first insulating layer and having a first innerlead and a first outerpad;

a second insulating film layer formed on said first connection layer;

a second connection layer formed on a back surface of said second insulating layer and having a second innerlead and a second outerpad, said second connection layer being electrically isolated from said first connection layer by an adhesive layer;

a third connection layer formed on a front surface of said second insulating film layer having a third innerlead and a third outerpad;

a first metal layer buried in a first through hole perforated in said second insulating layer and connected to said first outerpad; and a second metal layer buried in a second through hole perforated in said second insulating layer and connected to said second outerpad, said first, second and third innerleads protruding from said respective first and second insulating film layers.

7. The package as set forth in claim 6, wherein said first connection layer is a signal layer, said second connection layer is a power supply layer, and said third connection layer is a ground layer.

8. The package as set forth in claim 6, wherein said third connection layer is formed entirely on the front surface of said second insulating film layer.

9. The device as set forth in claim 2, wherein said first, second, and third innerleads are integrally formed with their respective first, second, and third connection layers.

10. The package as set forth in claim 6, wherein said first, second, and third innerleads are integrally formed with their respective first, second, and third connection layers.

* * * * *